US011979193B2

(12) United States Patent
Jang et al.

(10) Patent No.: US 11,979,193 B2
(45) Date of Patent: May 7, 2024

(54) COMMUNICATION METHOD AND DEVICE IN OPTICAL CAMERA COMMUNICATION SYSTEM

(71) Applicant: KOOKMIN UNIVERSITY INDUSTRY ACADEMY COOPERATION FOUNDATION, Seoul (KR)

(72) Inventors: Yeong Min Jang, Seoul (KR); Van Thang Nguyen, Seoul (KR); Minh Duc Thieu, Seoul (KR); Ngoc Nguyen Huy, Seoul (KR); Tung Lam Pham, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 228 days.

(21) Appl. No.: 17/625,662

(22) PCT Filed: Nov. 28, 2019

(86) PCT No.: PCT/KR2019/016595
§ 371 (c)(1),
(2) Date: Jun. 15, 2022

(87) PCT Pub. No.: WO2021/006433
PCT Pub. Date: Jan. 14, 2021

(65) Prior Publication Data
US 2022/0337323 A1    Oct. 20, 2022

(30) Foreign Application Priority Data

Jul. 8, 2019  (KR) .................. 10-2019-0082316
Oct. 24, 2019  (KR) .................. 10-2019-0133298
Oct. 24, 2019  (KR) .................. 10-2019-0133299

(51) Int. Cl.
*H04B 10/556* (2013.01)
*H04B 10/67* (2013.01)
(Continued)

(52) U.S. Cl.
CPC ......... *H04B 10/5561* (2013.01); *H04B 10/67* (2013.01); *H04L 1/0047* (2013.01); *H04N 7/22* (2013.01)

(58) Field of Classification Search
CPC ................................. H04B 10/5561
See application file for complete search history.

(56) References Cited

U.S. PATENT DOCUMENTS

2014/0290138 A1    10/2014  Oshima et al.
2018/0159624 A1*   6/2018  Jang ...................... H04B 10/676
(Continued)

FOREIGN PATENT DOCUMENTS

JP       2007-67973 A       3/2007
KR    10-2010-0055955 A     5/2010
(Continued)

OTHER PUBLICATIONS

M. D. Thieu, T. L. Pham, T. Nguyen and Y. M. Jang, "Optical-Rol-Signaling for Vehicular Communications," in IEEE Access, vol. 7, pp. 69873-69891, 2019, doi: 10.1109/ACCESS.2019.2918338. (Year: 2019).*
(Continued)

*Primary Examiner* — Nathan M Cors
(74) *Attorney, Agent, or Firm* — Nath, Goldberg & Meyer; Jerald L. Meyer; Morgan D. Rosenberg

(57) ABSTRACT

A method of modulating an optical camera communication (OCC) signal by an OCC transmission node in an OCC system includes acquiring a binary data signal, grouping the binary data signal for every k bits to convert the binary data signal into a global phase shift signal having an integer value
(Continued)

from 0 to M−1 (=$2^k$−1), generating a data signal group by mapping the global phase shift signal to first to Mth mapping sequences in the form of an n*M/2-bit sequence based on a preset symbol group mapping table, generating a pulse wave signal by modulating the data signal group, and blinking each of a plurality of light sources included in the OCC transmission node according to the pulse wave signal. Accordingly, performance of the communication system may be improved.

18 Claims, 25 Drawing Sheets

(51) Int. Cl.
*H04L 1/00* (2006.01)
*H04N 7/22* (2006.01)

(56) References Cited

U.S. PATENT DOCUMENTS

| | | | | |
|---|---|---|---|---|
| 2020/0092007 | A1* | 3/2020 | Jiang | H04B 10/1141 |
| 2022/0166516 | A1* | 5/2022 | Schultz | H04N 25/772 |

FOREIGN PATENT DOCUMENTS

| | | |
|---|---|---|
| KR | 10-2011-0055302 A | 5/2011 |
| KR | 10-1307610 A | 9/2013 |
| KR | 10-2014-0123764 A | 10/2014 |
| KR | 10-1625334 A | 5/2016 |
| KR | 10-2016-0137342 A | 11/2016 |
| KR | 10-2017-0085952 A | 7/2017 |
| KR | 10-2017-0085968 A | 7/2017 |

OTHER PUBLICATIONS

Nguyen, et al., "Design and Implementation of a Novel Compatible Encoding Scheme in the Time Domain for Image Sensor Communication", Sensors, vol. 16, No. 736, 2016.

Lartigue, et al., "High-efficient Manchester coding for beacon-to-CMOS camera in Visible Light Communications", 2018 Global LIFI Congress, 2018.

Jang, et al., "Kookmin PHY 4 modes—hybrid modulation schemes and cameras ISC modes", IEEE P802.15-16-0239-00-007a, (IEEE 802.15 documents server 2016.03.14 A).

Notification of Reason for Refusal dated Oct. 14, 2019 issued in corresponding Korean Application No. 10-2019-0082316.

Notification of Reason for Refusal dated Mar. 25, 2020 issued in corresponding Korean Application No. 10-2019-0133298.

Grant of Patent dated Jun. 12, 2020 issued in corresponding Korean Application No. 10-2019-0133299.

Search Report dated Apr. 8, 2020 issued in corresponding International Application No. PCT/KR2019/016595.

* cited by examiner

COMMUNICATION METHOD AND DEVICE IN OPTICAL CAMERA COMMUNICATION SYSTEM

TECHNICAL FIELD

The present invention relates to a method of transmitting and receiving a signal using optical camera communication (OCC), and more particularly to a method of modulating and transmitting an OCC signal and a method of demodulating a received OCC signal.

BACKGROUND ART

Recently, visible light communication (VLC) technology, which is a technology that enables wireless communication by adding a communication function to visible light wavelengths, has been actively researched, and the IEEE 802.15.7 international standard has been completed, so that business models have been developed for commercialization. However, IEEE 802.15.7 is mainly limited to data transmission using a photodetector (Photo Diode; PD), and thus there is a problem that a dedicated communication device such as a VLC dongle needs to be used. Accordingly, the international standardization of OCC, which mainly uses an image sensor such as a camera rather than a photodetector and includes not only visible light, but also infrared and ultraviolet wavelengths, has been in progress at IEEE 802.15.7m OWC TG (Task Group). OCC can be used in various fields, and in particular, can be used for vehicle-to-vehicle (V2V) communication and vehicle-to-everything (V2X) communication.

OCC can be greatly affected by an external environment in signal transmission/reception and modulation/demodulation due to the nature of remote communication using light and a camera. Accordingly, there is a need for a method for improving communication quality by improving signal modulation/demodulation performance in an OCC system.

DISCLOSURE

Technical Problem

An object of the present invention for solving the above-mentioned problems is to provide a method for modulation/demodulation of an OCC signal for improving performance of an OCC system.

Technical Solution

In accordance with an aspect of the present invention, the above and other objects can be accomplished by the provision of a transmission node including a processor, a memory configured to store one or more instructions executed by the processor, and a light emitting diode (LED) array including a plurality of LEDs blinking according to an instruction executed by the processor, in which the one or more instructions may be executed to modulate data in an orthogonal frequency division multiplexing scheme to generate a data frame, and blink the LEDs included in the LED array based on the data frame, thereby transmitting the data frame to a reception node, the data frame may include a preset number of data subframes, and each of the preset number of data subframes may include the same sequence number and the same payload.

Here, the one or more instructions may be further executed to receive a response message including information indicating that oversampling occurs from the reception node and decrease the number of data subframes.

Here, the response message may further include information about a photographing period of a camera included in the reception node, and the one or more instructions may be further executed to set the number of the data subframes to a value greater than or equal to a value obtained by dividing the photographing period indicated by the response message by a transmission period of the data subframes.

Here, the one or more instructions may be further executed to receive a response message including information about the number of pixels per bit of any image among images photographed by the camera included in the reception node from the reception node and set a size of the data subframe based on a size of the LED array and the number of pixels per bit, and the size of the data subframe may be a value less than or equal to a value obtained by dividing the size of the LED array by the number of pixels indicated by the response message.

In accordance with another aspect of the present invention, there is provided a reception node including a processor, a memory configured to store one or more instructions executed by the processor, and a camera configured to photograph blinking images of an LED array of a transmission node according to an instruction executed by the processor, in which the one or more instructions may be executed to acquire a plurality of data frames including a preset number of data subframes, each of which includes the same sequence number and the same payload, from blinking images of the LED array, determine whether oversampling occurs by comparing a frame rate of the camera and a blinking rate of the LED array, compare sequence numbers of the data subframes to acquire data subframes including different sequence numbers when oversampling occurs, acquire payloads included in the data subframes including the different sequence numbers, and merge the payloads in an order of the sequence numbers to decode the data frames.

Here, when it is determined that oversampling occurs, the one or more instructions may be further executed to transmit a response message including information indicating that oversampling occurs to the transmission node.

Here, the one or more instructions may be executed to receive a response message including information indicating a size of the LED array included in the transmission node from the transmission node, detect the number of pixels per bit of any image among images photographed by the camera, and set a size of the data subframes based on the size and state of the LED array and the number of pixels per bit, and the size of the data subframes may be a value less than or equal to a value obtained by dividing the size of the LED array indicated by the response message by the number of pixels.

Here, the one or more instructions may be further executed to set the number of pixels to be proportional to a period of a reference clock of the processor and inversely proportional to a frame rate of the camera.

In accordance with a further aspect of the present invention, there is provided a reception node including a processor, a memory configured to store one or more instructions executed by the processor, and a camera configured to photograph blinking images of an LED array of a transmission node according to an instruction executed by the processor, in which the one or more instructions may be executed to acquire a plurality of data frames including a preset number of data subframes, each of which includes the same sequence number and the same payload, from blinking images of the LED array, determine whether undersampling occurs by comparing a frame rate of the camera and a blinking rate of the LED array, compare the sequence numbers of the data subframes to detect a missing data frame when undersampling occurs, transmit a retransmission request message including information for requesting retransmission of the missing data frame to the transmission node, and decode the acquired data frames.

Here, the one or more instructions may be further executed to re-receive a missing data frame indicated by the retransmission request message from the transmission node and demodulate the data frame re-received from the transmission node.

Here, the one or more instructions may be further executed to acquire data by merging a result of demodulating the acquired data frames with a result of demodulating the data frame re-received from the transmission node.

Here, the one or more instructions may be further executed to receive a response message including information indicating a size of the LED array included in the transmission node from the transmission node, detect the number of pixels per bit of any image among images photographed by the camera, and set a size of the data subframes based on the size and state of the LED array and the number of pixels per bit, and the size of the data subframes may be a value less than or equal to a value obtained by dividing the size of the LED array indicated by the response message by the number of pixels.

Here, the one or more instructions may be further executed to set the number of pixels to be proportional to a period of a reference clock of the processor and inversely proportional to a frame rate of the camera.

In accordance with a further aspect of the present invention, there is provided a method of modulating an OCC signal by an OCC transmission node configured to transmit an OCC signal, the method including acquiring a binary data signal, grouping the binary data signal for every k bits to convert the binary data signal into a global phase shift signal having an integer value from 0 to M−1 (=$2^k$−1), generating a data signal group by mapping the global phase shift signal to first to Mth mapping sequences in a form of an n*M/2-bit sequence based on a preset symbol group mapping table, modulating the data signal group to generate a pulse wave signal, and blinking each of a plurality of light sources included in the OCC transmission node according to the pulse wave signal, in which the symbol group mapping table may indicate a connection relationship between the global phase shift signal having an integer value from 0 to M−1 and the first to Mth mapping sequences, and k and n may be integers greater than or equal to 3.

The first to Mth mapping sequences may be formed in a form of an n*M/2-bit sequence having M/2 n-bit bundles with n bits as a bundle.

In the first to M/2th mapping sequences, one n-bit bundle may have a value of 1, and (M/2−1) n-bit bundles may have a value of 0, and in the (M/2+1)th to Mth mapping sequences, one n-bit bundle may have a value of 0, and (M/2−1) n-bit bundles may have a value of 1.

k and n may be 3, the symbol group mapping table may further indicate a connection relationship between the global phase shift signal having an integer value of 0 to 7 and first to eighth three-symbol sequences, and a connection relationship between the first to eighth three-symbol sequences and the first to eighth mapping sequences, and each of the first to eighth three-symbol sequences may be generated to have three symbols.

The first three-symbol sequence may be generated to have three symbols set to 1, each of the second to fourth three-symbol sequences may be generated to have one symbol set to 5 and two symbols set to 0, each of the fifth to seventh three-symbol sequences may be generated to have one symbol set to 1 and two symbols set to 4, and the eighth three-symbol sequence may be generated to have three symbols set to 5.

Each of the first to eighth mapping sequences may be generated in a form of a 12-bit sequence by mapping each symbol of the first to eighth three-symbol sequences to a 4-bit signal according to the following table:

| Symbol (input) | 4-bit signal (output) |
|---|---|
| 0 | 0000 |
| 1 | 1000 |
| 4 | 1111 |
| 5 | 0111 |

In the symbol group mapping table, the (M/2+1)th to Mth mapping sequences may be generated by applying a NOT operation to the first to M/2th mapping sequences.

The symbol group mapping table may be formed so that a minimum Hamming distance between the first to Mth mapping sequences is 2n.

In accordance with a further aspect of the present invention, there is provided a method of demodulating an OCC signal by an OCC reception node configured to receive an OCC signal, the method including detecting blinking states of a plurality of light sources included in an OCC transmission node configured to transmit an OCC signal, converting blinking state information of the light sources into a binary sequence, grouping the binary sequence for every n*M/2 (=n*$2^{k-1}$) bits to acquire a data signal group of n*M/2 bits, acquiring a global phase shift signal from the data signal group based on a preset symbol group mapping table, and converting the global phase shift signal to acquire binary data, in which the symbol group mapping table may indicate a connection relationship between the global phase shift signal having an integer value from 0 to M−1 and first to Mth mapping sequences, and the (M/2+1)th to Mth mapping sequences may be generated by applying a NOT operation to the first to M/2th mapping sequences.

The symbol group mapping table may be formed so that a minimum Hamming distance between the first to Mth mapping sequences is 2n.

The acquiring of the global phase shift signal may include determining whether the data signal group coincides with any one of the first to Mth mapping sequences, and converting the data signal group into a global phase shift signal connected to a mapping sequence coinciding with the data signal group when the data signal group coincides with any one of the first to Mth mapping sequences.

The acquiring of the global phase shift signal may include determining whether the data signal group coincides with any one of the first to Mth mapping sequences, correcting an error of the data signal group based on a Hamming distance between the data signal group and the first to Mth mapping sequences when the data signal group does not coincide with any one of the first to Mth mapping sequences, generating an error-corrected data signal group, and determining again whether the error-corrected data signal group coincides with any one of the first to Mth mapping sequences, and the correcting of the error may be performed by an artificial neural network of the OCC reception node.

The method may further include calculating, after the correcting of the error, error information between a data signal group received by the OCC signal transmission node and the error-corrected data signal group, and updating a weight vector of the artificial neural network by back-propagating the error information.

In accordance with a further aspect of the present invention, there is provided an OCC transmission node for transmitting an OCC signal, the OCC transmission node including a processor, a plurality of light sources operating under a control of the processor, and a memory configured to store one or more instructions executed by the processor, in which the one or more instructions may be executed to acquire a binary data signal, group the binary data signal for every k bits to convert the binary data signal into a global phase shift signal having an integer value from 0 to M−1 ($=2^k-1$), generate a data signal group by mapping the global phase shift signal to first to Mth mapping sequences in a form of an n*M/2-bit sequence based on a preset symbol group mapping table, generate a pulse wave signal by modulating the data signal group, and blink each of the plurality of light sources according to the pulse wave signal, the symbol group mapping table may indicate a connection relationship between the global phase shift signal having an integer value from 0 to M−1 and the first to Mth mapping sequences, and k and n may be integers greater than or equal to 3.

The first to Mth mapping sequences may be formed in a form of an n*M/2-bit sequence having M/2 n-bit bundles with n bits as a bundle, in the first to M/2th mapping sequences, one n-bit bundle may have a value of 1, and (M/2−1) n-bit bundles may have a value of 0, and in the (M/2+1)th to Mth mapping sequences, one n-bit bundle may have a value of 0, and (M/2−1) n-bit bundles may have a value of 1.

In the OCC transmission node, k and n may be 3, the symbol group mapping table may further indicate a connection relationship between the global phase shift signal having an integer value of 0 to 7 and first to eighth three-symbol sequences, and a connection relationship between the first to eighth three-symbol sequences and the first to eighth mapping sequences, and each of the first to eighth three-symbol sequences may be generated to have three symbols.

In the OCC transmission node, the first three-symbol sequence may be generated to have three symbols set to 1, each of the second to fourth three-symbol sequences may be generated to have one symbol set to 5 and two symbols set to 0, each of the fifth to seventh three-symbol sequences may be generated to have one symbol set to 1 and two symbols set to 4, the eighth three-symbol sequence may be generated to have three symbols set to 5, and each of the first to eighth mapping sequences may be generated in a form of a 12-bit sequence by mapping each symbol of the first to eighth three-symbol sequences to a 4-bit signal according to the following table:

| Symbol (input) | 4-bit signal (output) |
| --- | --- |
| 0 | 0000 |
| 1 | 1000 |
| 4 | 1111 |
| 5 | 0111 |

In the OCC transmission node, in the symbol group mapping table, the (M/2+1)th to Mth mapping sequences may be generated by applying a NOT operation to the first to M/2th mapping sequences.

In accordance with a further aspect of the present invention, there is provided a method of demodulating an OCC signal by an OCC reception node configured to receive an OCC signal, the OCC reception node including a camera, an image processing unit, a filter unit, and a data extraction unit, the method including a photographing step of continuously photographing a blinking state of a light source to generate a plurality of image frames by the camera, a processing step of receiving the plurality of image frames from the camera to generate a brightness signal sequence from each of the plurality of image frames by the image processing unit, a detecting step of detecting a bit sequence from the brightness signal sequence by the filter unit, and an extracting step of extracting data from the bit sequence by the data extraction unit.

The filter unit may include a match filter, and the detecting step may include a step of generating an inversion sequence having the same length as a length of the brightness signal sequence, a step of performing a convolution operation on the brightness signal sequence and the inversion sequence, and a step of detecting the bit sequence from a result of the convolution operation.

The step of detecting the bit sequence may include detecting the bit sequence based on a point having a maximum value as a result of the convolution operation.

The step of generating the inversion sequence may include generating the inversion sequence based on a table preset according to a 4B6B encoding scheme.

The step of generating the inversion sequence may include generating the inversion sequence based on a table preset according to a Manchester encoding scheme.

The extracting step may include a restoring step of restoring a transmission payload from the bit sequence, and a step of extracting data from the transmission payload, the restoring step may include detecting a start frame from the bit sequence, a step of detecting a rear end asynchronous bit at a front end of the start frame, a step of detecting a front end asynchronous bit at a rear end of the start frame, a step of comparing values of the front end and rear end asynchronous bits, and a step of restoring a transmission payload based on the front end and rear end asynchronous bits.

When front end or rear end asynchronous bits having the same value are included in a plurality of consecutive bit sequences, the restoring step may include restoring the transmission payload by merging a plurality of payloads included in the plurality of consecutive bit sequences.

When front end or rear end asynchronous bits having the same value are included in one bit sequence, the restoring step may include restoring the transmission payload by merging a plurality of payloads included in the one bit sequence.

In accordance with a further aspect of the present invention, there is provided an OCC signal demodulation device included in a reception node configured to receive an OCC signal, the demodulation device including a processor, a memory configured to store one or more instructions executed by the processor, a camera, an image processing unit, a filter unit, and a data extraction unit, in which the one or more instructions may be executed to continuously photograph a blinking state of a light source to generate a plurality of image frames by the camera, generate a brightness signal sequence from each of the plurality of image frames generated by the camera by the image processing unit, detect a bit sequence from the brightness signal sequence by the filter unit, and extract data from the bit sequence by the data extraction unit.

The one or more instructions may be further executed to generate an inversion sequence having the same length as a length of the brightness signal sequence by a match filter included in the filter unit, and perform a convolution operation on the brightness signal sequence and the inversion sequence to detect the bit sequence from a result of the convolution operation.

The one or more instructions may be further executed to detect the bit sequence based on a point having a maximum value as a result of the convolution operation by the match filter.

The one or more instructions may be further executed to generate the inversion sequence based on a table preset according to a 4B6B encoding scheme by the match filter.

The one or more instructions may be further executed to generate the inversion sequence based on a table preset according to a Manchester encoding scheme by the match filter.

The one or more instructions may be further executed to detect a rear end asynchronous bit at a front end of a start frame and a front end asynchronous bit at a rear end of the start frame to restore a transmission payload based on the front end and rear end asynchronous bits by the data extraction unit.

When front end or rear end asynchronous bits having the same value are included in a plurality of consecutive bit sequences, the one or more instructions may be further executed to restore the transmission payload by merging a plurality of payloads included in the plurality of consecutive bit sequences by the data extraction unit.

When front end or rear end asynchronous bits having the same value are included in one bit sequence, the one or more instructions may be further executed to restore the transmission payload by merging a plurality of payloads included in the one bit sequence by the data extraction unit.

Advantageous Effects

According to the invention, since a data frame includes a plurality of data subframes including the same sequence number in a communication system, loss of transmitted data can be prevented even when undersampling or oversampling occurs according to a change in camera frame rate of a reception node.

According to an embodiment of the present invention, binary data is converted into a data signal group and converted based on a preset symbol group mapping table such that a minimum Hamming distance between groups is 2n under a condition of code rate 1/n, so that it is possible to improve OCC signal decoding performance and error correction performance using artificial intelligence.

According to an embodiment of the present invention, by applying a match filter in detecting a bit sequence from a brightness signal generated by photographing a blinking state of a light source in an OCC system, it is possible to effectively receive and demodulate an OCC signal under a condition other than an ideal indoor environmental condition, such as a condition where a distance between a light source and a camera is long or there are a large number of light sources other than the light source of the OCC system, or an outdoor environmental condition.

DESCRIPTION OF DRAWINGS

The above and other objects, features and other advantages of the present invention will be more clearly understood from the following detailed description taken in conjunction with the accompanying drawings, in which.

BEST MODE

Figure 1:
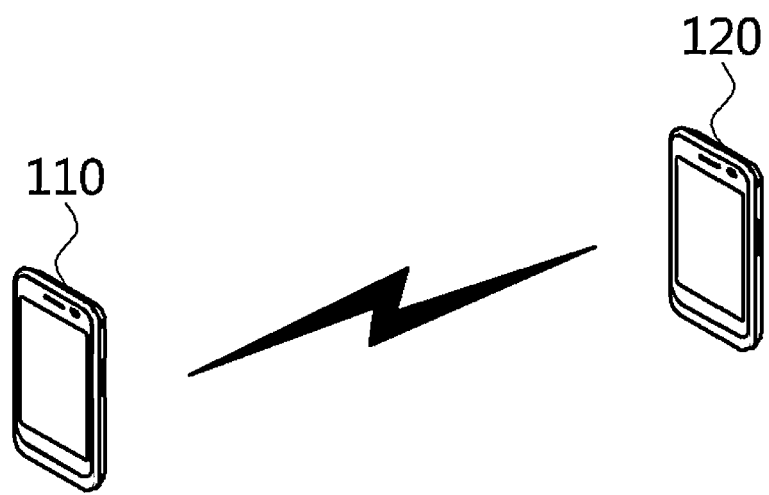
FIG. 1 is a conceptual diagram illustrating a communication system according to a first embodiment of the present invention.

Since the present invention can have various modifications and can have various embodiments, specific embodiments are illustrated in the drawings and described in detail. However, this is not intended to limit the present invention to the specific embodiments, and it should be understood to include all modifications, equivalents, or substitutes within the spirit and scope of the present invention.

Terms such as first, second, etc. may be used to describe various components. However, the components should not be limited by the terms. The above terms are used only for the purpose of distinguishing one component from another. For example, without departing from the scope of the present invention, a first component may be referred to as a second component, and similarly, the second component may be referred to as the first component. The term "and/or" includes a combination of a plurality of related listed items or any of a plurality of related listed items.

When it is mentioned that a certain component is "coupled" or "connected" to another component, the component may be directly coupled or connected to another component. However, it should be understood that another component may be present therebetween. On the other hand, when it is mentioned that a certain component is "directly coupled" or "directly connected" to another component, it should be understood that no other component is present therebetween.

Terms used in the present application are only used to describe specific embodiments, and are not intended to limit the present invention. A singular expression includes a plural expression unless the context clearly dictates otherwise. In the present application, it should be understood that a term such as "include" or "have" is intended to designate that a feature, number, step, operation, component, part, or a combination thereof described in the specification is present, and does preclude the possibility of the presence or addition of one or more other features, numbers, steps, operations, components, parts, or combinations thereof.

Unless defined otherwise, all terms used herein, including technical or scientific terms, have the same meaning as commonly understood by those skilled in the art to which the present invention belongs. Terms such as those defined in a commonly used dictionary should be interpreted as having meanings consistent with meanings in the context of the related art, and should not be interpreted as having ideal or excessively formal meanings unless explicitly defined in the present application.

Hereinafter, preferred embodiments of the present invention will be described in more detail with reference to the accompanying drawings. In describing the present invention, in order to facilitate the overall understanding, the same reference numerals are used for the same components in the drawings, and duplicate descriptions of the same components are omitted.

A communication system to which the embodiments according to the present invention are applied will be described. The communication system to which the embodiments according to the present invention are applied is not limited to content described below, and the embodiments according to the present invention can be applied to various communication systems. Here, the communication system may be used synonymously with a communication network.

Hereinafter, a communication system according to a first embodiment of the present invention will be described with reference to FIGS. 1 to 11.

FIG. 1 is a conceptual diagram illustrating the communication system according to the first embodiment of the present invention.

Referring to FIG. 1, the communication system may include a plurality of communication nodes 110 and 120. The plurality of communication nodes 110 and 120 may perform communication using communication methods defined in Institute of Electrical and Electronics Engineers (IEEE) 802.15.7 (for example, IEEE 802.15.7m). For example, each of the plurality of communication nodes 110 and 120 may include an LED and a camera, transmit a signal by blinking the LED, and acquire a signal based on a blinking state of the LED photographed by the camera. Each of the plurality of communication nodes 110 and 120 may be a sensor node, an Internet of Things (IoT) node, a smart phone, etc. Each of the plurality of communication nodes 110 and 120 may have the following structure.

Figure 2:
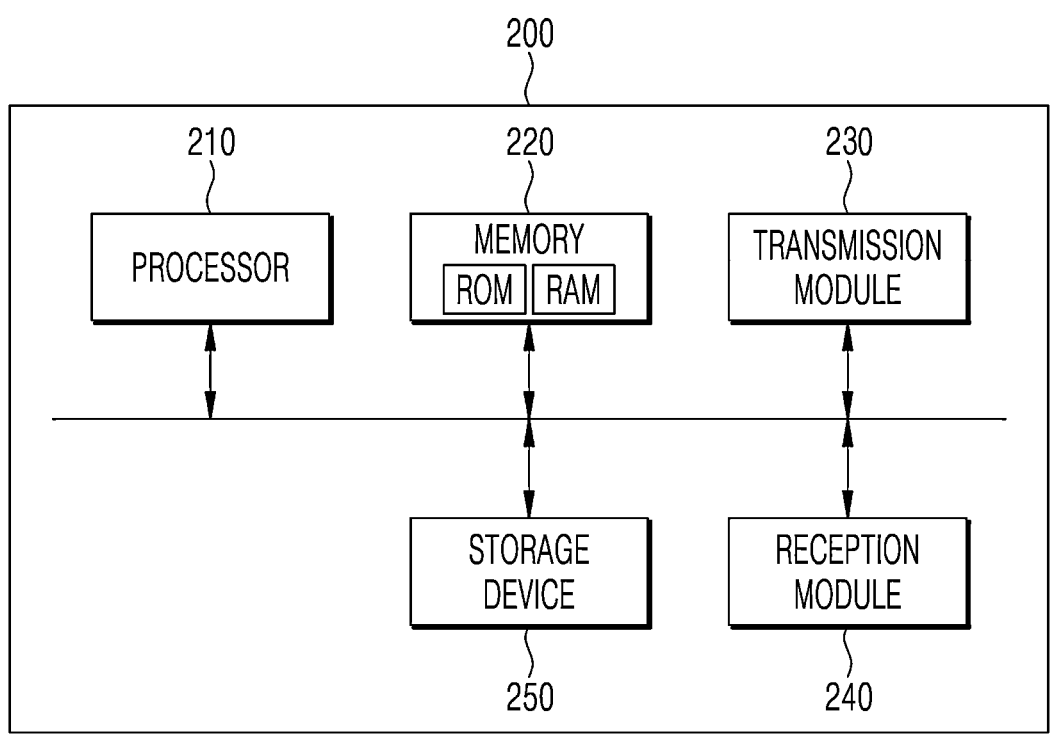
FIG. 2 is a block diagram illustrating a communication node included in the communication system according to the first embodiment of the present invention.

FIG. 2 is a block diagram illustrating a communication node included in the communication system according to the first embodiment of the present invention.

Referring to FIG. 2, a communication node 200 may include a processor 210, a memory 220, a transmission module 230, and a reception module 240. In addition, the communication node 200 may further include a storage device 250, etc. Each of the components included in the communication node 200 may be connected by a bus 260 to communicate with each other.

However, each of the components included in the communication node 200 may be connected through an individual interface or an individual bus centering on the processor 210 rather than the common bus 260. For example, the processor 210 may be connected to at least one of the memory 220, the transmission module 230, the reception module 240, and the storage device 250 through a dedicated interface.

The processor 210 may execute a program command stored in at least one of the memory 220 and the storage device 250. The processor 210 may refer to a central processing unit (CPU), a graphics processing unit (GPU), or a dedicated processor configured to execute methods according to embodiments of the present invention. Each of the memory 220 and the storage device 250 may be configured as at least one of a volatile storage medium and a nonvolatile storage medium. For example, the memory 220 may be configured as at least one of a read only memory (ROM) and a random access memory (RAM).

The transmission module 230 may include an LED array and may operate under the control of the processor 210. The reception module 240 may include a camera and may operate under the control of the processor 210. The transmission module 230 may be configured as follows.

Figure 3:
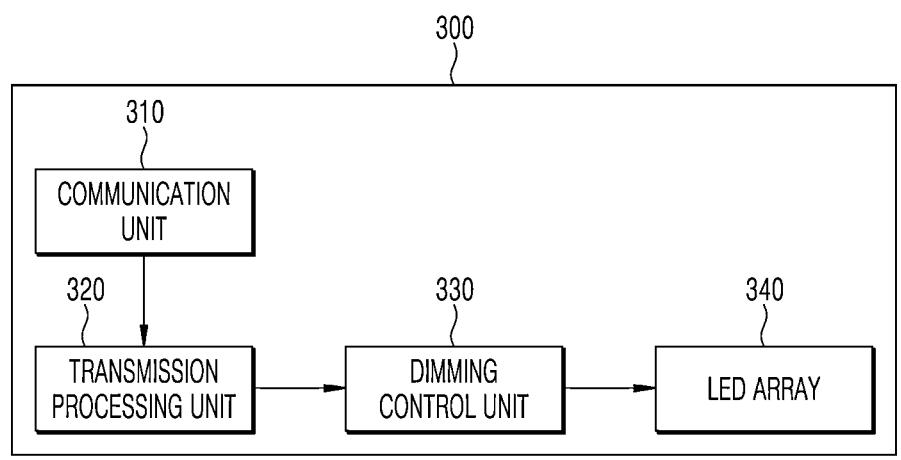
FIG. 3 is a block diagram illustrating a transmission module included in the communication node in the communication system according to the first embodiment of the present invention.

FIG. 3 is a block diagram illustrating a transmission module included in the communication node in the communication system according to the first embodiment of the present invention.

Referring to FIG. 3, the transmission module 300 may include a communication unit 310, a transmission processing unit 320, a dimming control unit 330, and an LED array 340. Here, the transmission module 300 may be configured similarly to or identical to the transmission module 230 of FIG. 2. The communication unit 310 may communicate with a reception module 600 (refer to FIG. 6). The communication unit 310 may transmit a response message including specific information (for example, a response message including information indicating a size of the LED array 340) to the reception module 600, and receive a response message including specific information (for example, a response message including information indicating that oversampling occurs in the reception module 600) from the reception module 600. The transmission processing unit 320 may process an input signal using an orthogonal frequency division multiplexing (OFDM) scheme.

The transmission processing unit 320 may be configured as follows.

Figure 4:
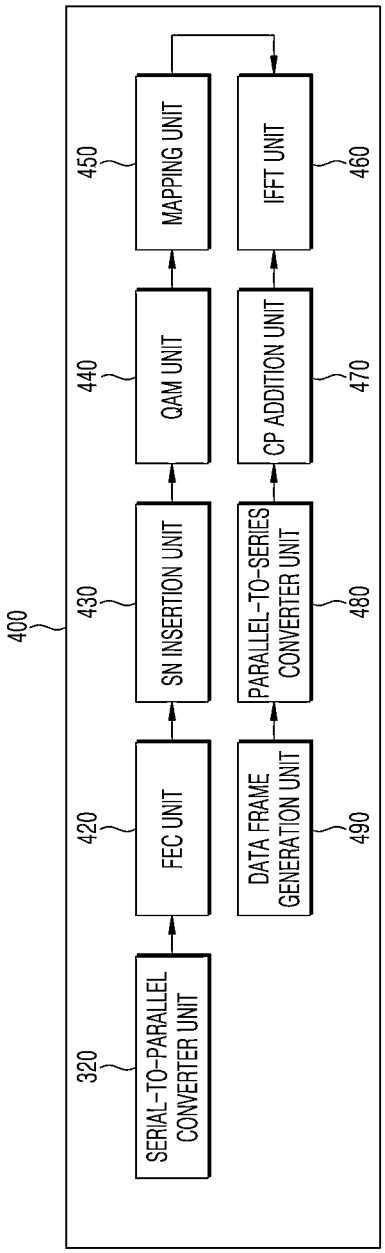
FIG. 4 is a block diagram illustrating a transmission processing unit included in the transmission module in the communication system according to the first embodiment of the present invention.

FIG. 4 is a block diagram illustrating a transmission processing unit included in the transmission module in the communication system according to the first embodiment of the present invention.

Referring to FIG. 4, a transmission processing unit 400 may include a serial-to-parallel converter unit 410, a forward error correction (FEC) encoder 420, an SN insertion unit 430, a quadrature amplitude modulation (QAM) unit 440, a mapping unit 450, an inverse fast Fourier transform (IFFT) unit 460, a cyclic prefix (CP) addition unit 470, a parallel-to-series converter unit 480, and a data frame generation unit 490. In the embodiments, a unit may mean a means, an entity, an apparatus, etc. for performing a specific function.

A serial bit stream may be input to the serial-to-parallel converter unit 410. The serial-to-parallel converter unit 410 may convert a plurality of input serial bit streams into a parallel form. The serial-to-parallel converter unit 410 may transmit a bit stream in a parallel form to the FEC encoder 420.

The FEC encoder 420 may receive a bit stream in a parallel form from the serial-to-parallel converter unit 410. The FEC encoder 420 may add additional information for FEC to each bit stream. Here, "bit stream+additional information" may be a payload (for example, a data symbol (DS)). The FEC encoder 420 may transmit the payload to the SN insertion unit 430.

The SN insertion unit 430 may receive a payload from the FEC encoder 420. The SN insertion unit 430 may add a sequence number to a front end of the payload. Here, "sequence number+payload" may be a data subframe. The SN insertion unit 430 may transmit a data subframe to the QAM unit. The QAM unit 440 may receive the data subframe from the SN insertion unit 430. The QAM unit 440 may modulate the data subframe using a QAM scheme. For example, the QAM unit 440 may modulate the data subframe in a 16-QAM or 64-QAM scheme. When the data subframe is modulated using the 16-QAM scheme, the payload may be quantized to 16 levels and mapped to 16 coordinates of an I/Q plot. When the data subframe is modulated using the 64-QAM scheme, the data subframe may be quantized to 64 levels and mapped to 64 coordinates of the I/Q plot. The data subframe modulated by the QAM scheme may include a real part and an imaginary part according to the coordinates of the I/Q plot. The QAM unit 440 may transmit the data subframe modulated by the QAM scheme to the mapping unit 450.

The mapping unit 450 may receive the data subframe modulated by the QAM scheme from the QAM unit 440. The mapping unit 440 may include, for example, a Hermitian matrix. Here, the Hermitian matrix may be a matrix in which a main diagonal component is a real number, remaining components are complex numbers, and components opposite to each other with respect to a diagonal have a complex conjugate relationship. When the mapping unit 450 includes the Hermitian matrix, the mapping unit 460 may perform mapping to remove the imaginary part of the data subframe modulated by the QAM scheme. The mapping unit 450 may transmit the mapped data subframe to the IFFT unit 460.

The IFFT unit 460 may receive the mapped data subframe from the mapping unit 450. The IFFT unit 460 may transform a data subframe in the frequency domain into a data subframe in the time domain using an IFFT scheme. In addition, the IFFT unit may convert a data subframe in the frequency domain into a data subframe in the time domain using an inverse discrete Fourier transform (IDFT) scheme. The IFFT unit 460 may transmit the data subframe in the time domain to the CP addition unit 470. The CP addition unit 470 may receive the data subframe in the time domain from the IFFT unit 460. The CP addition unit 470 may insert a CP into the data subframe in the time domain. That is, the CP addition unit 470 may insert the CP into the data subframe in the time domain and transmit the data subframe to the parallel-to-series converter unit 480.

The parallel-to-series converter unit 480 may receive the CP-inserted data subframe from the CP addition unit 470. The parallel-to-series converter unit 480 may convert parallel data subframes into serial data subframes. The parallel-to-series converter unit 480 may transmit a serial data subframe to the data frame generation unit 490. The data frame generation unit 490 may receive serial data subframes from the parallel-to-series converter unit 480. The data frame generation unit 490 may generate a data frame by merging data subframes. That is, the data frame generation unit 490 may generate a data frame by merging data subframes including the same sequence number and the same payload.

Meanwhile, the data frame generated by the transmission processing unit 400 may be as follows.

Figure 5:
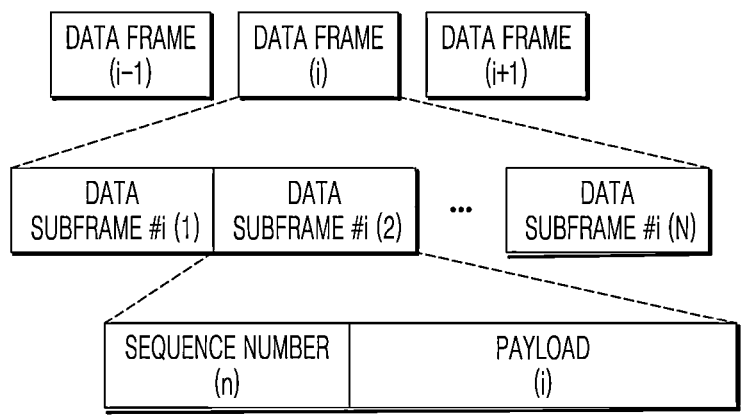
FIG. 5 is a conceptual diagram illustrating a data frame in the communication system according to the first embodiment of the present invention.

FIG. 5 is a conceptual diagram illustrating a data frame in the communication system according to the first embodiment of the present invention.

Referring to FIG. 5, a plurality of data frames may be generated in a communication node. Payloads (for example, DSs) included in each of the plurality of data frames may be different from each other. One data frame may include a plurality of data subframes, and a plurality of data subframes included in one data frame may include the same payload (for example, DS). That is, to prevent missing data to be transmitted, the same payload may be repeatedly transmitted through the same data subframe. A data frame rate may be defined as the number of data frames including different payloads among data frames transmitted in a specific section. A data frame may be designed to support both an oversampling scheme and an undersampling scheme. Oversampling scheme may be a sampling scheme used when a frame rate of the camera (that is, a camera 610 illustrated in FIG. 6) is faster than the data frame rate. Undersampling scheme may be a sampling scheme used when the frame rate of the camera (that is, the camera 610 illustrated in FIG. 6) is slower than the data frame rate.

Referring back to FIG. 3, the dimming control unit 330 may receive data frames from the transmission processing unit 320. The dimming control unit 330 may blink the LED array 340 at a preset blink rate based on the data frame. The dimming control unit 330 may transmit a data frame to the reception module 600 (refer to FIG. 6) by blinking the LED array 340.

Figure 6:
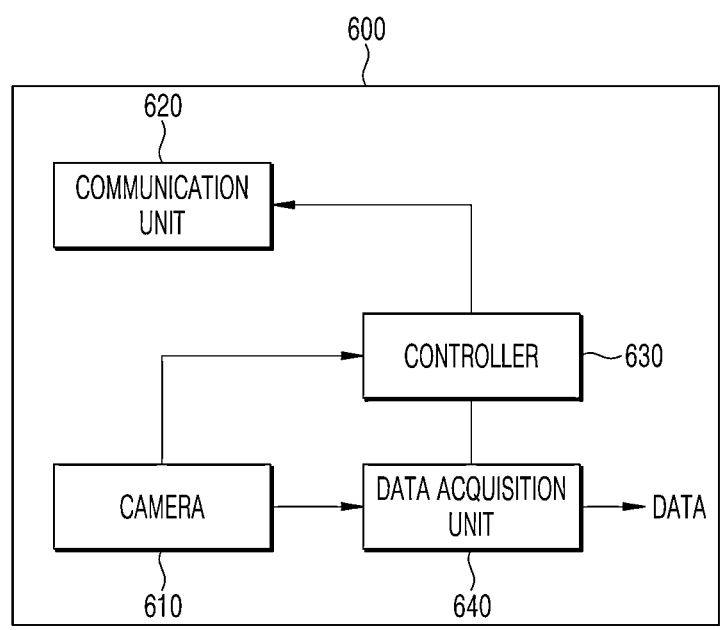
FIG. 6 is a block diagram illustrating a reception module included in a reception node in the communication system according to the first embodiment of the present invention.

FIG. 6 is a block diagram illustrating the reception module included in a reception node in the communication system according to the first embodiment of the present invention.

Referring to FIG. 6, the reception module 600 may include a camera 610, a communication unit 620, a comparison unit 630, and a data acquisition unit 640. The reception module 600 may be configured similarly or identically to the reception module 240 of FIG. 2. The camera 610 may transmit information about the frame rate of the camera to the comparison unit 630. In addition, the camera 610 may photograph blinking images of the LED array 340 (refer to FIG. 3) included in the transmission module 300 (refer to FIG. 3). The camera 610 may transmit the photographed blinking images to the comparison unit 630 and the data acquisition unit 640.

The communication unit 620 may communicate with the transmission module 300 (refer to FIG. 3). The communication unit 620 may transmit a response message including specific information to the transmission module 300 (for example, a response message including information indicating that oversampling occurs to the transmission module 300), and receive a response message including specific information (for example, a response message including information indicating the size of the LED array 340 (refer to FIG. 3)) from the transmission module 300.

The comparison unit 630 may receive information about the frame rate of the camera 610 and the blinking images of the LED array 340 from the camera 610. The comparison unit 630 may obtain a blinking rate of the LED array 340 from the blinking images of the LED array 340. The comparison unit 630 may compare the frame rate of the camera 610 with the blinking rate of the LED array 340 to determine whether oversampling or undersampling occurs in the reception module 600. When it is determined that oversampling occurs in the reception module 600, the comparison unit 630 may transmit information indicating that oversampling occurs to the data acquisition unit 640. In addition, the comparison unit 630 may generate a response message including information indicating that oversampling occurs in the reception module 600. The comparison unit 630 may transmit the response message including the information indicating that oversampling occurs to the transmission module 300 through the communication unit 620. In addition, when it is determined that undersampling occurs in the reception module 600, the comparison unit 630 may transmit information indicating that undersampling occurs to the data acquisition unit 640. When a data frame is missing due to occurrence of undersampling, the comparison unit 630 may generate a retransmission message requesting retransmission of the missing data frame. The comparison unit 630 may transmit the retransmission message to the transmission module 300 through the communication unit 620.

The data acquisition unit 640 may receive images obtained by photographing the blinking state of the LED array 340 from the camera 610. The data acquisition unit 640 may acquire data by processing an image obtained by photographing the blinking state of the LED array 340. The data acquisition unit 640 may receive information indicating that oversampling or undersampling occurs in the reception module 600 from the comparison unit 630. In addition, upon receiving information indicating that undersampling occurs, the data acquisition unit 640 may detect a missing data frame and transmit information about the missing data frame to the comparison unit 630.

Meanwhile, the data acquisition unit 640 may be configured as follows.

Figure 7:
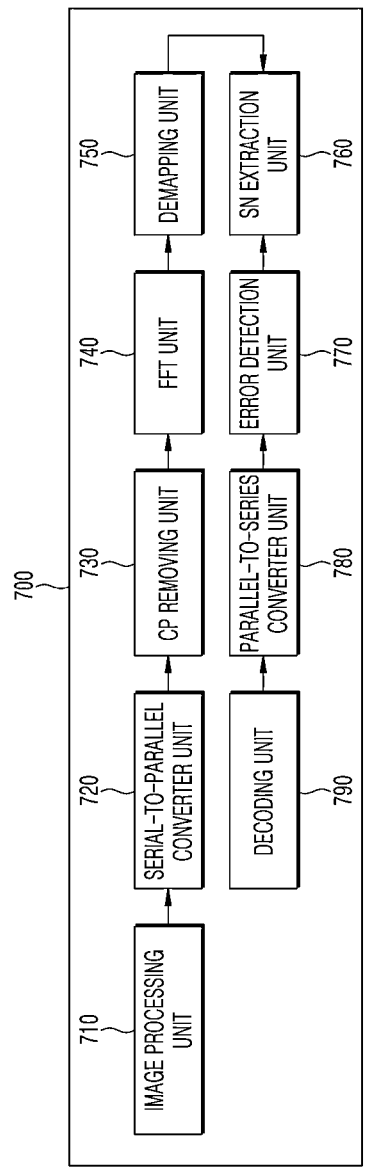
FIG. 7 is a block diagram illustrating a data acquisition unit included in the reception module in the communication system according to the first embodiment of the present invention.

FIG. 7 is a block diagram illustrating the data acquisition unit included in the reception module in the communication system according to the first embodiment of the present invention.

Referring to FIG. 7, the data acquisition unit 700 may include an image processing unit 710, a serial-to-parallel converter unit 720, a CP removing unit 730, a fast Fourier transform (FFT) unit 740, demapping unit 750, a sequence number (SN) extraction unit 760, an error detection unit 770, a parallel-to-series converter unit 780, and a decoding unit 790.

The image processing unit 710 may receive blinking images from the camera 610 (refer to FIG. 6). The image processing unit 710 may process images received from the camera to obtain bit streams in serial form. The image processing unit 710 may transmit the serial-form bit streams to the serial-to-parallel converter unit 720.

The serial-to-parallel converter unit 720 may receive bit streams in serial form from the image processing unit 710. The serial-to-parallel converter unit 720 may convert the bit streams into bit streams in parallel form.

The serial-to-parallel converter unit 720 may transmit parallel-form bit streams to the CP removing unit 730. The CP removing unit 730 may receive bit streams in parallel form from the serial-to-parallel converter unit 720. The CP removing unit 730 may remove the CP inserted into each bit stream. The CP removing unit 730 may transmit the CP-removed bit streams to the FFT unit 740. The FFT unit 740 may transform the CP-removed bit streams from time domain bit streams into frequency domain bit streams using an FFT scheme. The FFT unit 740 may transmit the bit streams transformed into the frequency domain bit streams to the demapping unit 750. The demapping unit 750 may receive the bit streams transformed into the frequency domain bit streams from the FFT unit 740. The demapping unit 750 may perform a demapping operation on bit streams transformed into frequency domain bit streams. The demapping unit 750 may transmit each of the demapped bit streams to the SN extraction unit 760. The SN extraction unit 760 may receive the demapped bit streams from the demapping unit 750. The SN extraction unit 760 may acquire sequence numbers included in the demapped bit streams. In addition, the SN extraction unit 760 may compare the acquired sequence numbers. That is, upon receiving information indicating that undersampling occurs in the reception module 600 (refer to FIG. 6) from the comparison unit 630, the SN extraction unit 760 may compare the sequence numbers to detect a missing data frame. The SN extraction unit 760 may transmit the bit streams to the error detection unit 770. Here, each of the bit streams may be a bit stream from which a sequence number is extracted.

The error detection unit 770 may receive the bit streams from which the sequence numbers are extracted from the SN extraction unit 760. The error detection unit 770 may detect whether an error occurs in the bit streams. When an error occurs in the bit streams, the error detection unit 770 may transmit a message requesting retransmission of data frames through the communication unit 620 (refer to FIG. 6). When no errors occur in the bit streams, the error detection unit 770 may transmit the bit streams to the parallel-to-series converter unit.

The parallel-to-series converter unit 780 may receive bit streams from the error detection unit 770. The parallel-to-series converter unit 780 may convert the bit streams in parallel form into bit streams in serial form. The parallel-to-series converter unit 780 may transmit the bit streams in serial form to the decoding unit 790.

The decoding unit 790 may receive the bit streams in serial form from the parallel-to-series converter unit 780. Upon receiving information indicating that oversampling occurs in the reception module 600 from the comparison unit 630, the decoding unit 790 may compare the sequence numbers acquired by the SN extraction unit 760 to acquire bit streams including different sequence numbers one by one. The decoding unit 790 may acquire a payload from each of the bit streams including different sequence numbers. The decoding unit 790 may merge the acquired payloads, and may acquire first data by decoding the merged payloads.

Upon receiving information indicating that undersampling occurs in the reception module 600 from the comparison unit 630, the decoding unit 790 may first demodulate the received bit streams to acquire data. The decoding unit 790 may detect a missing data frame by comparing sequence numbers of the bit streams extracted by the SN extraction unit 760. Thereafter, the decoding unit 790 may re-receive a bit stream included in the missing data frame from the transmission module 300 (refer to FIG. 3). The decoding unit may acquire a payload from the re-received bit stream, and may decode the acquired payload to acquire second data. Thereafter, the decoding unit 790 may acquire data by merging the first data and the second data.

Next, methods of transmitting and receiving data in the communication system will be described. When a method (for example, transmission or reception of a signal) performed in a first communication node among communication nodes is described, a corresponding second communication node may perform a method (for example, reception or transmission of a signal) corresponding to the method performed by the first communication node. That is, when an operation of a terminal is described, a corresponding base station may perform an operation corresponding to the operation of the terminal. Conversely, when the operation of the base station is described, a corresponding terminal may perform an operation corresponding to the operation of the base station.

Figure 8:
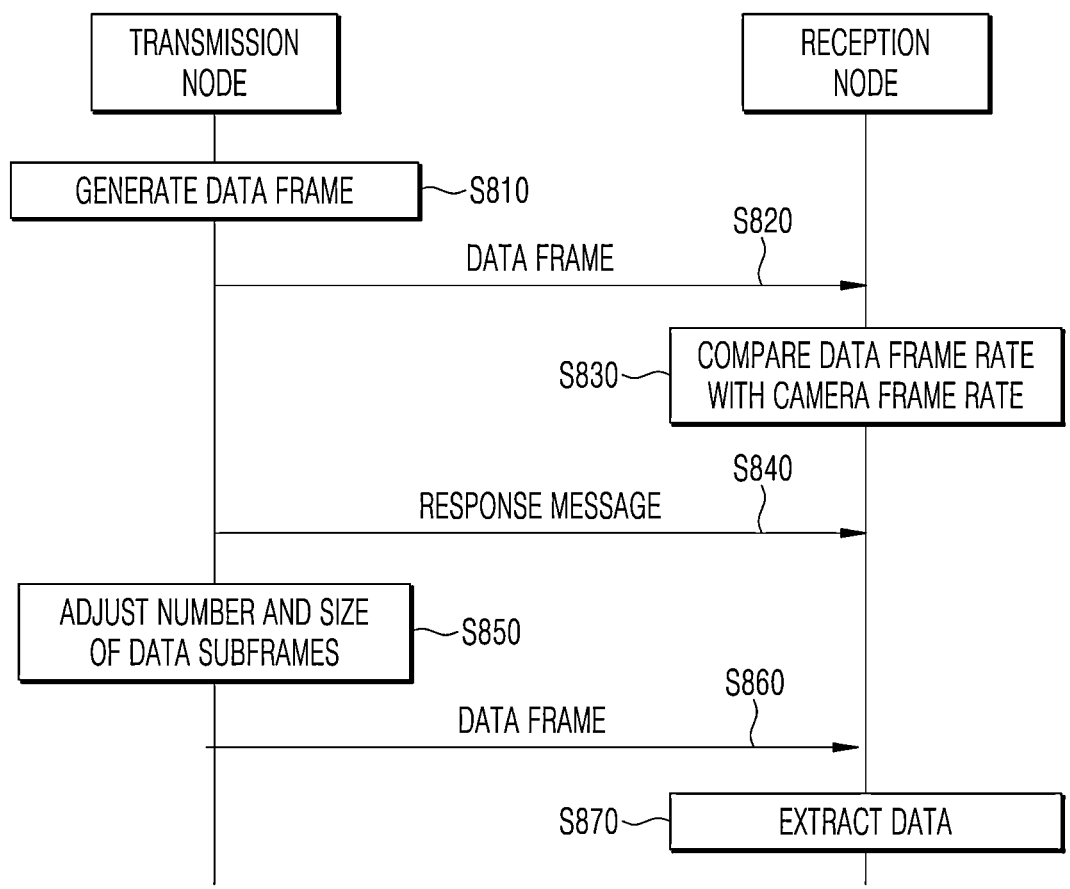
FIG. 8 is a flowchart illustrating a data transmission/reception method in the communication system according to the first embodiment of the present invention.

FIG. 8 is a flowchart illustrating a data transmission/reception method in the communication system according to the first embodiment of the present invention.

Referring to FIG. 8, the communication system may include a transmission node and a reception node. The transmission node may be the transmission node 110 of FIG. 1, and the reception node may be the reception node 120 of FIG. 1. Each of the transmission node and the reception node may be configured the same as or similar to the communication node 200 illustrated in FIG. 2. A transmission module included in each of the transmission node and the reception node may be configured the same as or similar to that of the embodiments illustrated in FIGS. 3 and 4. A reception module included in each of the transmission node and the reception node may be configured the same as or similar to that of the embodiments illustrated in FIGS. 6 and 7.

The transmission node may generate data frames (S810). The data frames may be generated by a transmission processing unit (for example, the transmission processing unit 320 of FIG. 3), and may be configured the same as or similar to the data frame illustrated in FIG. 5. The transmission node may transmit the generated data frames to the reception node (S820). In this case, the data frames may be transmitted to the reception node by blinking an LED array (for example, the LED array 340 illustrated in FIG. 3).

The reception node may receive data frames from the transmission node. That is, the reception node may acquire images by photographing a blinking state of the LED array using a camera (for example, the camera 610 illustrated in FIG. 6), and may acquire data frames from the images. In addition, a comparison unit (for example, the comparison unit 630 of FIG. 6) of the reception node may acquire a blinking rate of the LED array from the images and may acquire a data frame rate of the transmission node through the blinking rate.

The reception node may compare the data frame rate with a camera frame rate (S830). The comparison unit of the reception node may compare the rate of the data frame with the rate of the camera frame, thereby determining whether oversampling occurs in the reception node. When the camera frame rate exceeds the data frame rate, the comparison unit of the reception node may determine that oversampling occurs in the reception node. The comparison unit of the reception node may generate a response message including information indicating that oversampling occurs, and transmit a response message including information indicating that oversampling occurs in the transmission node through a transmission unit (for example, the transmission unit 620 of FIG. 6) of the reception node (S840). Here, the response message may further include information about the frame rate of the camera included in the reception node and information about the number of pixels per bit in any image among images photographed by the camera.

The transmission node may receive a response message from the reception node. That is, the transmission node may receive a response message including information indicating that oversampling occurs through a communication unit (for example, the communication unit 310 of FIG. 3) of the transmission node, information about the frame rate of the camera, and information about the number of pixels per bit in any image among images photographed by the camera.

The transmission node may acquire information indicating that oversampling occurs in the reception node through the received response message. The transmission node may adjust the number and size of data subframes included in each data frame based on the information included in the response message (S850).

The transmission node may set the number of data subframes based on the frame rate of the camera and a transmission period of the data subframes indicated by the response message. When oversampling occurs in the reception node, the transmission node may reduce the number of data subframes included in each of the data frames. Here, the number of data subframes may be expressed by the following Formula 1.

$$N_{sub\,frame} \geq \frac{\text{Frame rate}}{T_{sub\,frame}} \quad \text{[Formula 1]}$$

Here, $N_{subframe}$ may denote the number of data subframes, Frame rate may denote the frame rate of the camera, and $T_{subframe}$ may denote a transmission period of a data subframe.

In addition, the transmission node may set a size of a data subframe. Here, the size of the data subframe may be expressed by the following Formula 2.

$$S_{sub\,frame} \le \frac{LED\,ARRAY\_size}{N_{pixel/bit}} \qquad \text{[Formula 2]}$$

Here, $S_{subframe}$ may denote a size of a data subframe, LED ARRAY_size may denote a size of an LED array, and $N_{pixel/bit}$ may denote the number of pixels per bit in an image. Meanwhile, the number of pixels per bit in an image may be expressed by the following Formula 3.

$$N_{pixel/bit} = \frac{T_{clock}}{T_{camera}} \qquad \text{[Formula 3]}$$

Here, $N_{pixel/bit}$ may denote the number of pixels per bit in an image, $T_{clock}$ may denote a clock period of the reception node, and $T_{camera}$ may denote a photographing period of the camera. The transmission node may transmit data frames to the reception node (S860). Here, the data frames may include data subframes whose number and size are adjusted. The reception node may receive data frames from the transmission node. The reception node may extract data from the data frames received from the transmission node (S870). That is, a data extraction unit (for example, the data extraction unit 640 of FIG. 6) of the reception node may compare sequence numbers included in the data subframes to decode the data.

When oversampling occurs in the reception node, a method of acquiring data by the reception node may be as follows.

Figure 9:
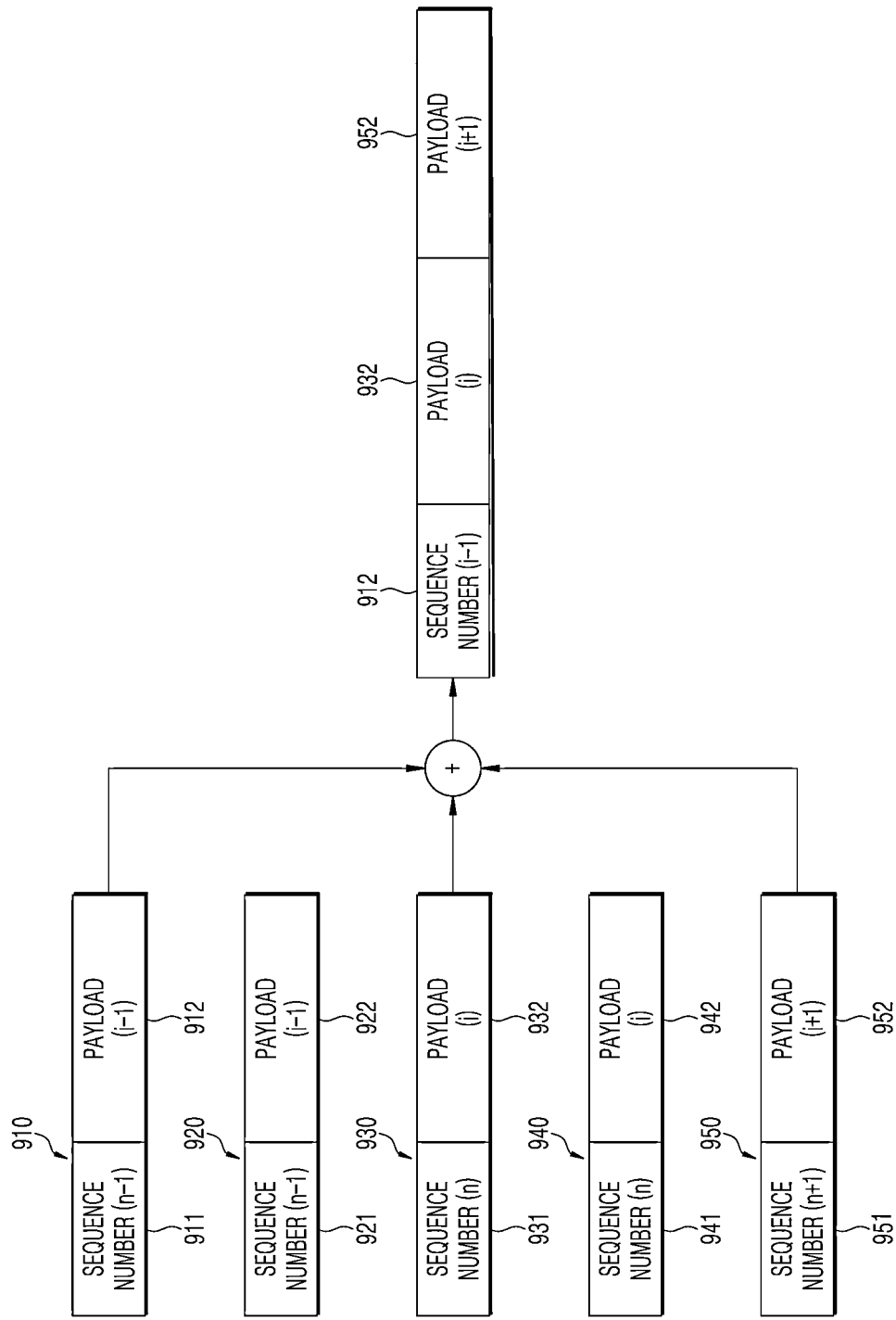
FIG. 9 is a conceptual diagram illustrating a decoding method in the communication system according to the first embodiment of the present invention.

FIG. 9 is a conceptual diagram illustrating a decoding method in the communication system according to the first embodiment of the present invention.

Referring to FIG. 9, the communication system may include a plurality of data subframes 910, 920, 930, 940, and 950. Here, the plurality of data subframes 910, 920, 930, 940, and 950 may be similar to or identical to the data subframe illustrated in FIG. 5. The plurality of data subframes 910, 920, 930, 940, and 950 may include sequence numbers 911, 921, 931, 941, and 951 and payloads 912, 922, 932, 942, and 952, respectively. Here, the first data subframe 910 and the second data subframe 920 may include the same sequence numbers 911 and 921 and the same payloads 912 and 922, and may be included in the same data frame (for example, a data frame (i−1)). The third data subframe 930 and the fourth data subframe 940 may include the same sequence numbers 931 and 941 and the same payloads 932 and 942, and may be included in the same data frame (for example, a data frame (i)).

A data extraction unit (for example, the data extraction unit 640 of FIG. 6) of the reception node may compare the sequence numbers 911, 921, 931, 941, and 951 included in the plurality of data subframes 910, 920, 930, 940, and 950. The data extraction unit may acquire a payload included in any one of data subframes including the same sequence number. For example, it is possible to acquire the payload 912 included in the first data subframe 910 out of the first data subframe 910 and the second data subframe 920, acquire the payload 912 included in the third data subframe 930 out of the third data subframe 930 and the fourth data subframe 940, and acquire the payload 952 included in the fifth data subframe 950. The data extraction unit may merge the acquired payloads 912, 932, and 952 in order. The data extraction unit may decode the merged payload to acquire data.

Figure 10:
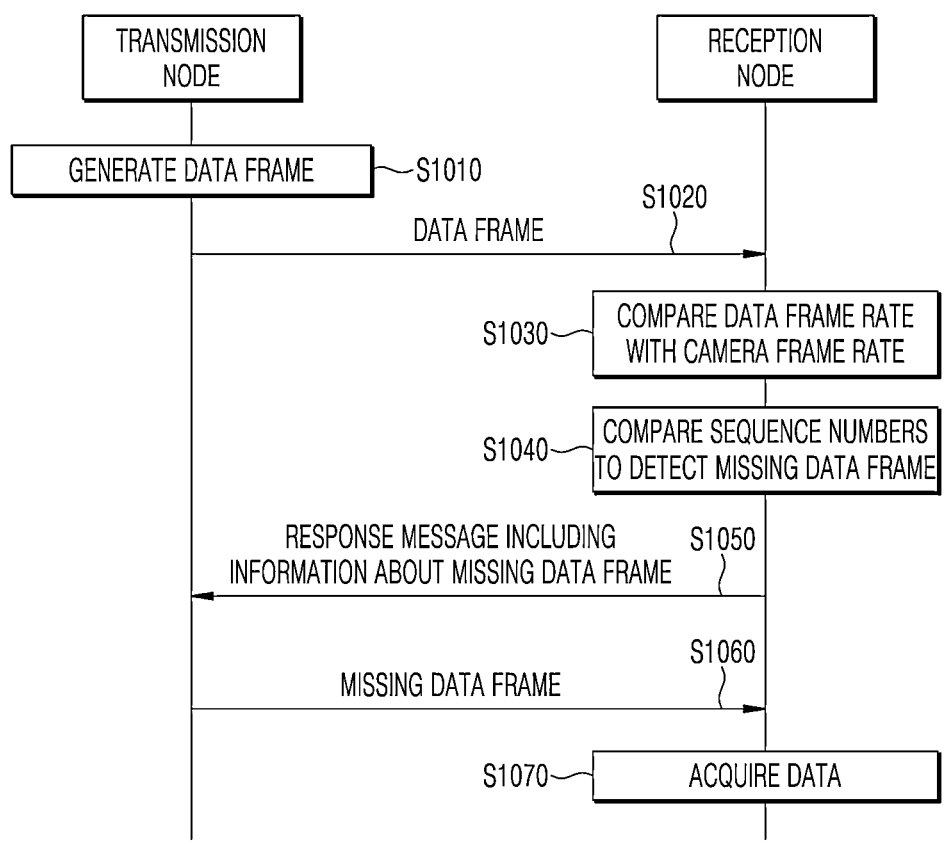
FIG. 10 is a flowchart illustrating a data transmission/reception method in a communication system according to a 1-2th embodiment of the present invention.

FIG. 10 is a flowchart illustrating a data transmission/reception method in a communication system according to a 1-2th embodiment of the present invention.

Referring to FIG. 10, the communication system may include a transmission node and a reception node. The transmission node may be the transmission node 110 of FIG. 1, and the reception node may be the reception node 120 of FIG. 1. Each of the transmission node and the reception node may be configured the same as or similar to the communication node 200 illustrated in FIG. 2. A transmission module included in each of the transmission node and the reception node may be configured the same as or similar to the embodiment illustrated in FIGS. 3 and 4. A reception module included in each of the transmission node and the reception node may be configured the same as or similar to the embodiment illustrated in FIGS. 6 and 7.

The transmission node may generate data frames (S1010). The data frames may be generated by a transmission processing unit (for example, the transmission processing unit 320 of FIG. 3), and may be configured the same as or similar to the data frame illustrated in FIG. 5. The transmission node may transmit the generated data frames to the reception node (S1020). In this case, the data frames may be transmitted to the reception node by blinking an LED array (for example, the LED array 340 illustrated in FIG. 3).

The reception node may receive data frames from the transmission node. That is, the reception node may acquire images by photographing the blinking state of the LED array using a camera (for example, the camera 610 illustrated in FIG. 6), and may acquire data frames from the images. In addition, a comparison unit (for example, the comparison unit 630 of FIG. 6) of the reception node may acquire a blinking rate of the LED array from the images and acquire a data frame rate of the transmission node through the blinking rate.

The reception node may compare the data frame rate with a camera frame rate (S1030). The comparison unit of the reception node may compare the rate of the data frame with the rate of the camera frame, thereby determining whether undersampling occurs in the reception node. When the camera frame rate is less than the data frame rate, the comparison unit of the reception node may determine that undersampling occurs in the reception node. A data acquisition unit (for example, the data acquisition unit 640 of FIG. 6) of the reception node may detect a data frame that is missing due to undersampling.

Figure 11:
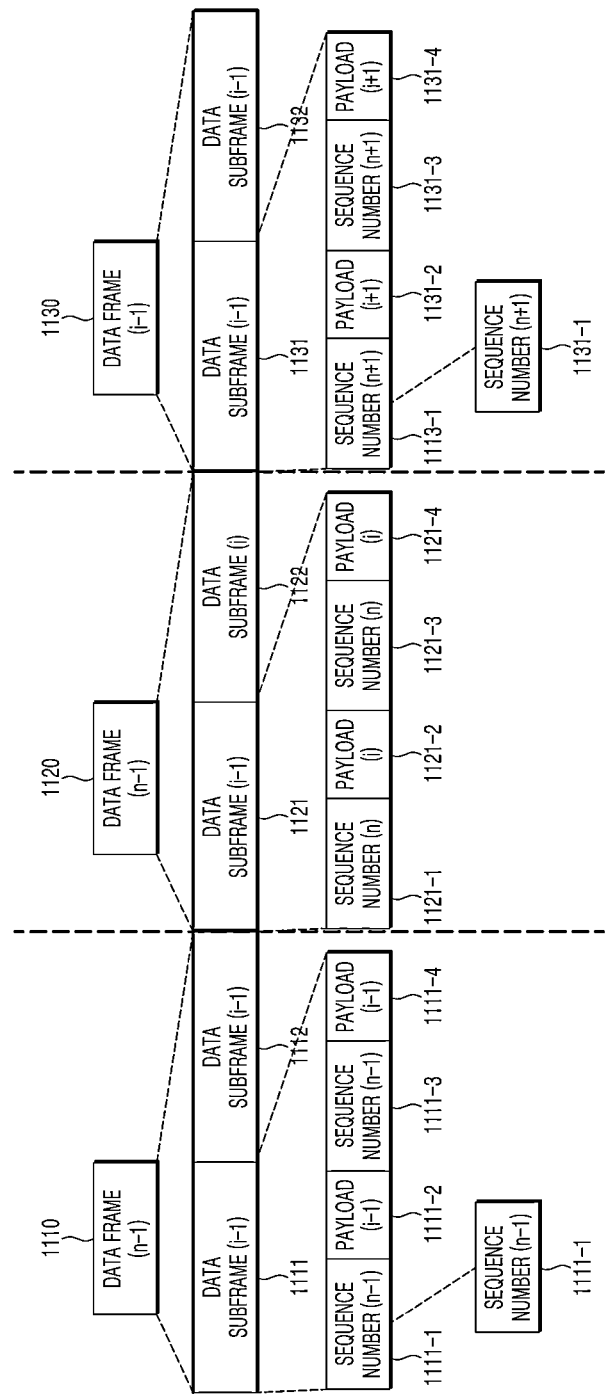
FIG. 11 is a conceptual diagram illustrating a method of detecting a missing data frame in the communication system according to the first embodiment of the present invention.

FIG. 11 is a conceptual diagram illustrating a method of detecting a missing data frame in the communication system according to the first embodiment of the present invention.

Referring to FIG. 11, the communication system may include a plurality of data frames 1110, 1120, and 1130. The plurality of data frames may be similar to or identical to the data frame illustrated in FIG. 5. Each of the plurality of data frames 1110, 1120, and 1130 may include a plurality of data subframes 1111, 1112, 1121, 1122, 1131, and 1132, and each of the data subframes 1111, 1112, 1121, 1122, 1131, and 1132 may include a plurality of sequence numbers and payloads. Here, sequence numbers and payloads of data subframes included in the same data frame may be the same. For example, the data subframes 1111 and 1112 included in the first data frame 1110 may include the same sequence numbers 1111-1 and 1111-3, and include the same payloads 1111-2 and 1111-4.

A data acquisition unit (for example, the data acquisition unit 640 of FIG. 6) of the reception node may acquire sequence numbers included in data subframes, and detect a missing data frame by comparing the sequence numbers. For example, when the data acquisition unit acquires sequence numbers n−1 (1111-1) and n+1 (1131-1), it may be determined that the second data frame 1120 having a sequence number n is missing.

Referring back to FIG. 10, the data acquisition unit of the reception node may acquire first data by decoding the data frames acquired in step S1020 (S1050).

In addition, the data acquisition unit of the reception node may transmit a response message including information about the missing data frame to the transmission node (S1060). The data acquisition unit of the reception node may transmit a response message to the transmission node through the communication unit 620 of the reception node. The transmission node may receive a response message including information about the missing data frame from the reception node, and retransmit the missing data frame indicated by the response message to the reception node (S1070). That is, the transmission node may transmit the missing data frame to the reception node by blinking an LED array (for example, the LED array 340 of FIG. 3) included in the transmission node.

The reception node may re-receive the missing data frame from the transmission node. The reception node may re-receive the missing data frame by photographing the blinking state of the LED array using a camera. The reception node may acquire second data by decoding the data frame acquired in step S1060.

The reception node may acquire data by merging the first data and the second data.

Hereinafter, a communication system according to a second embodiment of the present invention will be described with reference to FIGS. 12 to 17.

Figure 12:
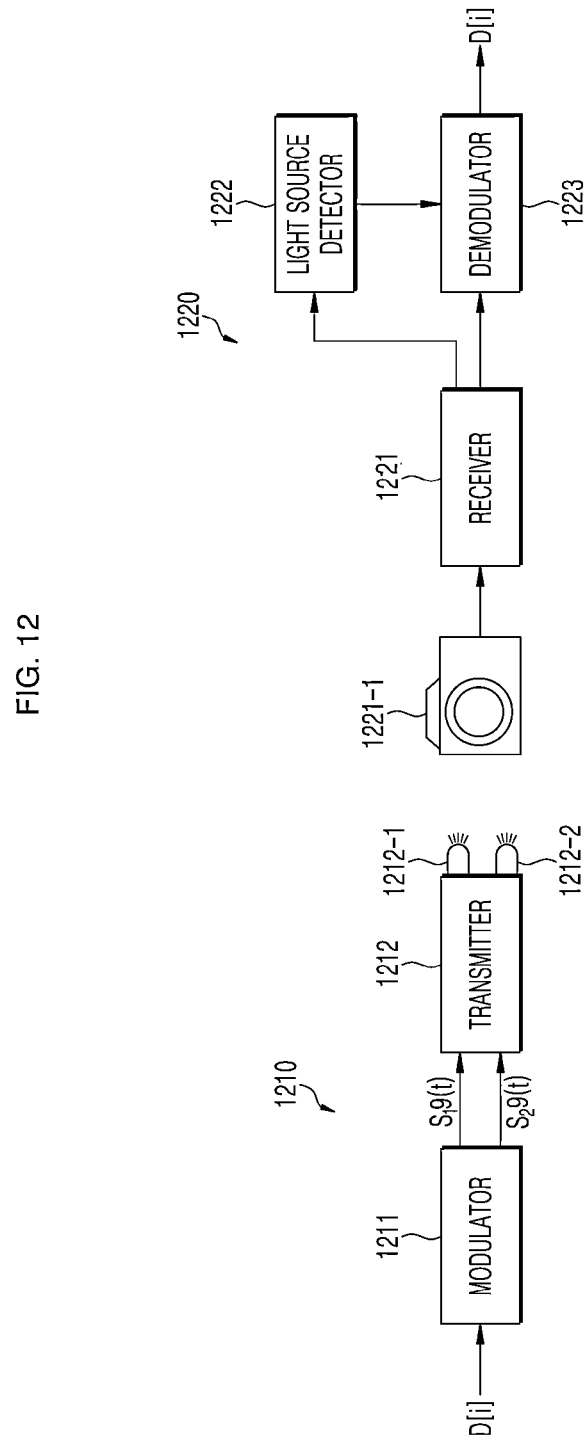
FIG. 12 is a block diagram illustrating an OCC system according to a second embodiment of the present invention.

FIG. 12 is a block diagram illustrating an OCC system according to the second embodiment of the present invention.

Referring to FIG. 12, the OCC system according to the second embodiment of the present invention may include an optical wireless transmission device 1210 and an optical wireless reception device 1220. The optical wireless transmission device 1210 may include a modulator 1211 and a transmitter 1212. The transmitter 1212 may include one or more light sources 1212-1 and 1212-2, and the light sources 1212-1 and 1212-2 may be LEDs. The optical wireless reception device 1220 may include a receiver 1221 and a demodulator 1223, and may further include a light source detector 1222. The receiver 1221 may include an image sensor 1221-1, such as a camera.

The modulator 1211 may receive a binary data signal D[i], which is a bit sequence to be transmitted, and generate binary data signals $S_a(t)$ and $S_2(t)$ having modulated pulse waveforms. $S_1(t)$ and $S_2(t)$ may be continuous signals or discrete signals.

The transmitter 1212 may transmit data by blinking each of the plurality of light sources 1212-1 and 1212-2 according to the binary data signals $S_1(t)$ and $S_2(t)$. Here, blinking does not necessarily indicate a scheme in which the light sources 1212-1 and 1212-2 are completely turned ON and completely turned OFF, and may include all schemes in which two states of binary values 0 and 1 are expressed using a change in brightness of the light sources 1212-1 and 1212-2. When a blinking frequency of the light sources 1212-1 and 1212-2 is equal to or greater than a certain value (for example, 200 Hz), a person may not perceive the blinking of the light sources 1212-1 and 1212-2.

The receiver 1221 may receive an image sequence obtained by the image sensor 1221-1 continuously photographing (sampling) the light sources 1212-1 and 1212-2. The light source detector 1222 may detect positions of the light sources 1212-1 and 1212-2 in the received image. The demodulator 1223 may demodulate the data signal from the blinking states of the light sources 1212-1 and 1212-2.

Figure 13:
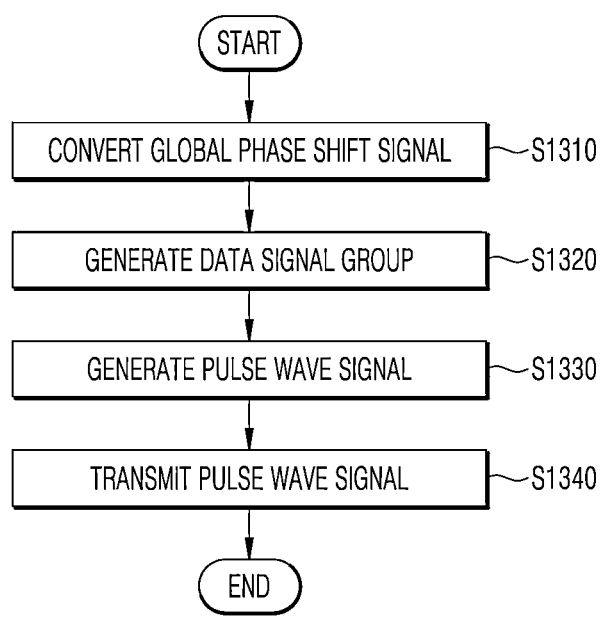
FIG. 13 is a flowchart illustrating an OCC signal transmission operation of an OCC transmission node according to the second embodiment of the present invention.

FIG. 13 is a flowchart illustrating an OCC signal transmission operation of an OCC transmission node according to the second embodiment of the present invention.

Referring to FIG. 13, the OCC transmission node 1210 may acquire a binary data signal D[i]. In addition, the modulator 1211 of the OCC transmission node 1210 may group an acquired binary data signal in units of a plurality of preset bits to convert the signal into a global phase shift signal having an integer value from 0 to M−1 ($=2^k-1$) (S1310). The modulator 1211 of the OCC transmission node 1210 may convert a binary data signal into a global phase shift signal according to a modulation scheme of a transmitted signal. The modulator of the OCC transmission node may modulate a binary data signal according to a modulation scheme such as M-ASK (M-amplitude shift keying), M-FSK (M-frequency shift keying), M-PSK (M-phase shift keying), or DSM-PSK (dimmable spatial M-phase shift keying). For example, when M=8 and k=3, the modulator 1211 of the OCC transmission node 1210 may convert a binary data signal into a global phase shift signal according to Table 1 (S1310).

TABLE 1

| 3-bit data (input) | Global phase shift signal (output) |
|---|---|
| 000 | 0 |
| 001 | 1 |
| 010 | 2 |
| 011 | 3 |
| 100 | 4 |
| 101 | 5 |
| 110 | 6 |
| 111 | 7 |

The modulator 1211 of the OCC transmission node 1210 may convert a binary data signal into a global phase shift signal according to Table 1, and each global phase shift signal acquired as a result of conversion may indicate a group ID of a data signal group transmitted by the OCC transmission node 1210.

The modulator 1211 of the OCC transmission node 1210 may generate a data signal group including a plurality of symbols based on the acquired group ID (S1320). Specifically, the modulator 1211 of the OCC transmission node 1210 may generate a data signal group based on a preset symbol group mapping table (S1320). The symbol group mapping table may be defined according to a modulation scheme of a signal transmitted by the OCC transmission node 1210.

The symbol group mapping table may indicate a connection relationship between global phase shift signals having integer values from 0 to M−1 and first to Mth mapping sequences in the form of an n*M/2-bit sequence (here, n has an integer value of 3 or more). That is, the symbol group mapping table includes global phase shift signals having integer values from 0 to M−1 and first to Mth mapping sequences in the form of an n*M/2-bit sequence, and each of the global phase shift signals may correspond to each of the first to Mth mapping sequences one-to-one.

In the symbol group mapping table according to the 2-1th embodiment of the present invention, the first to Mth mapping sequences may be formed in the form of an n*M/2-bit sequence having M/2 n-bit bundles with n bits as a bundle.

In the first to M/2th mapping sequences, one n-bit bundle may have a value of 1, and M/2−1 n-bit bundles may have a value of 0.

For example, in the first mapping sequence, the first n-bit bundle may have a value of 1, in the second mapping sequence, the second n-bit bundle may have a value of 1, and in the M/2th mapping sequence, the M/2th n-bit bundle may have a value of 1.

The M/2+1th to Mth mapping sequences may be generated by applying a NOT operation to the first to M/2th mapping sequences.

For example, when M=8 and k=3, the symbol group mapping table according to the 2-1th embodiment of the present invention may be defined as shown in Table 2.

TABLE 2

| Global shift phase signal (input) | No. | 4n-bit sequence (output) |
|---|---|---|
| 0 | First mapping sequence | 11 . . . 11 00 . . . 00 00 . . . 00 00 . . . 00 |
| 1 | Second mapping sequence | 00 . . . 00 11 . . . 11 00 . . . 00 00 . . . 00 |
| 2 | Third mapping sequence | 00 . . . 00 00 . . . 00 11 . . . 11 00 . . . 00 |
| 3 | Fourth mapping sequence | 00 . . . 00 00 . . . 00 00 . . . 00 11 . . . 11 |
| 4 | Fifth mapping sequence | 11 . . . 11 11 . . . 11 11 . . . 11 00 . . . 00 |
| 5 | Sixth mapping sequence | 11 . . . 11 11 . . . 11 00 . . . 00 11 . . . 11 |
| 6 | Seventh mapping sequence | 11 . . . 11 00 . . . 00 11 . . . 11 11 . . . 11 |
| 7 | Eighth mapping sequence | 00 . . . 00 11 . . . 11 11 . . . 11 11 . . . 11 |

A Hamming distance between data signal groups generated according to the symbol group mapping table of Table 2 may be calculated by Formula 4.

$$d = \sum_{i}^{4n} d_{hamming}(S_i(A), S_i(B))$$ [Formula 4]

Formula 4 may indicate the sum of Hamming distances between first to 4n-th symbols included in a data signal group. A Hamming distance between symbols may be a Hamming distance between symbols shown in Table 2. As described above, a Hamming distance between data signal groups generated according to the symbol group mapping table of Table 2 may be generated to be equal to or greater than a preset threshold value. For example, a minimum Hamming distance of data signal groups generated according to the symbol group mapping table of Table 2 may be 2n.

For example, when M=8, k=3, and n=3, a symbol group mapping table according to the 2-1th embodiment of the present invention may be defined as shown in Table 3.

TABLE 3

| Global shift phase signal (input) | No. | 12-bit sequence (output) |
|---|---|---|
| 0 | First mapping sequence | 111 000 000 000 |
| 1 | Second mapping sequence | 000 111 000 000 |
| 2 | Third mapping sequence | 000 000 111 000 |
| 3 | Fourth mapping sequence | 000 000 000 111 |
| 4 | Fifth mapping sequence | 111 111 111 000 |
| 5 | Sixth mapping sequence | 111 111 000 111 |
| 6 | Seventh mapping sequence | 111 000 111 111 |
| 7 | Eighth mapping sequence | 000 111 111 111 |

A Hamming distance between data signal groups generated according to the symbol group mapping table of Table 3 may be calculated by Formula 5.

$$d = \sum_{i}^{12} d_{hamming}(S_i(A), S_i(B))$$ [Formula 5]

Formula 5 may indicate the sum of Hamming distances between first to twelfth symbols included in a data signal group. A Hamming distance between symbols may be a Hamming distance between symbols shown in Table 3. As described above, a Hamming distance between data signal groups generated according to the symbol group mapping table of Table 3 may be generated to be equal to or greater than a preset threshold value. For example, a minimum Hamming distance of data signal groups generated according to the symbol group mapping table of Table 3 may be 6.

The modulator 1211 of the OCC transmission node 1210 that transmits a signal modulated by an 8-PSK scheme may generate any one data signal group included in a symbol group mapping table from a global shift signal based on the symbol group mapping table of Table 2 or 3. When a signal according to an 8-PSK modulation scheme is transmitted, the modulator 1211 of the OCC transmission node 1210 may generate a data signal group having a 4n-bit or 12-bit form (S1320).

In a 2-2th embodiment of the present invention, k=3 and n=3, and a symbol group mapping table may indicate a connection relationship between global phase shift signals having integer values of 0 to 7 and first to eighth 3-symbol sequences and a connection relationship between the first to eighth three-symbol sequences and first to eighth mapping sequences. Here, each of the first to eighth three-symbol sequences may be generated to have three symbols.

The first 3-symbol sequence may include three symbols set to 1. Each of the second to fourth 3-symbol sequences may include one symbol set to 5 and two symbols set to 0. Each of the fifth to seventh 3-symbol sequences may include one symbol set to 1 and two symbols set to 4. In addition, the eighth 3-symbol sequence may include three symbols set to 5.

For example, in the 2-2th embodiment of the present invention, a connection relationship between global phase shift signals having integer values of 0 to 7 and the first to eighth three-symbol sequences may be defined as shown in Table 4.

TABLE 4

| Global shift phase signal (input) | No. | 3-symbol sequence (output) |
|---|---|---|
| 0 | First three-symbol sequence | 111 |
| 1 | Second three-symbol sequence | 005 |
| 2 | Third three-symbol sequence | 050 |
| 3 | Fourth three-symbol sequence | 500 |
| 4 | Fifth three-symbol sequence | 144 |
| 5 | Sixth three-symbol sequence | 414 |
| 6 | Seventh three-symbol sequence | 441 |
| 7 | Eighth three-symbol sequence | 555 |

Each of the first to eighth mapping sequences may be generated in the form of a 12-bit sequence by mapping each symbol of the first to eighth three-symbol sequences defined in Table 4 to a 4-bit signal according to Table 5.

TABLE 5

| Symbol (input) | 4-bit signal (output) |
|---|---|
| 0 | 0000 |
| 1 | 1000 |
| 4 | 1111 |
| 5 | 0111 |

For example, a symbol group mapping table according to the second embodiment of the present invention may be defined as shown in Table 6.

TABLE 6

| Global shift phase signal (input) | 3-symbol sequence | 12-bit sequence |
|---|---|---|
| 0 | 111 | 100010001000 |
| 1 | 005 | 000000000111 |
| 2 | 050 | 000001110000 |
| 3 | 500 | 011100000000 |
| 4 | 144 | 100011111111 |
| 5 | 414 | 111110001111 |
| 6 | 441 | 111111111000 |
| 7 | 555 | 011101110111 |

A Hamming distance between data signal groups generated according to the symbol group mapping table of Table 6 may be calculated by Formula 6.

$$d = \sum_{i}^{12} d_{hamming}(S_i(A), S_i(B))$$ [Formula 6]

Formula 6 may indicate the sum of the Hamming distances between the first to twelfth symbols included in the data signal group. The Hamming distance between symbols may be the Hamming distance between symbols shown in Table 6. As described above, the Hamming distance between data signal groups generated according to the symbol group mapping table of Table 6 may be generated to be equal to or greater than a preset threshold value. For example, a minimum Hamming distance of data signal groups generated according to the symbol group mapping table of Table 6 may be 6.

The modulator 1211 of the OCC transmission node 1210, which transmits a signal modulated by the 8-PSK scheme, may generate any one data signal group included in the symbol group mapping table from a global shift signal based on the symbol group mapping table of Table 6. When a signal according to the 8-PSK modulation scheme is transmitted, the modulator 1211 of the OCC transmission node 1210 may generate a data signal group having a 12-bit form (S1320).

The modulator 1211 of the OCC transmission node 1210 may generate a data signal group based on the symbol group mapping table of Table 2, Table 3, or Table 6 (S1320), and modulate the data signal group to generate a plurality of pulse wave signals (S1330). The modulator 1211 of the OCC transmission node 1210 may transmit the plurality of pulse wave signals to the transmitter 1212 of the OCC transmission node 1210.

The transmitter 1212 of the OCC transmission node 1210 may acquire pulse wave signals from the modulator 1211 of the OCC transmission node 1210. In addition, the transmitter 1212 of the OCC transmission node 1210 may transmit a signal by blinking each of the light sources (for example, LED, etc.) included in the transmitter 1212 according to the generated plurality of pulse wave signals (S1340).

Figure 14:
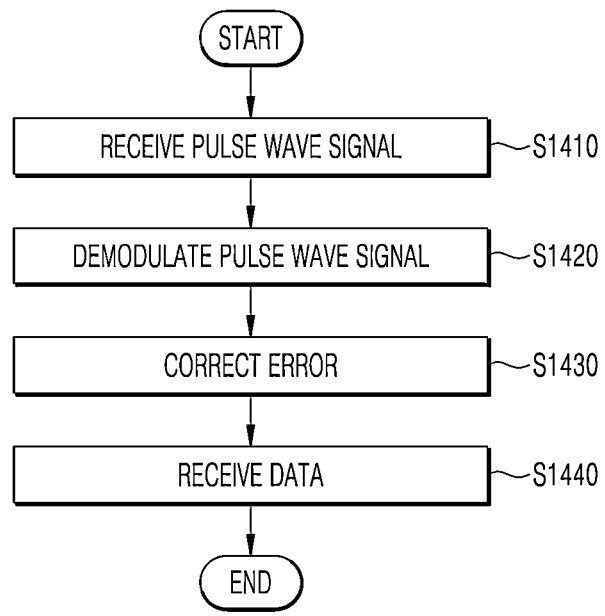
FIG. 14 is a flowchart illustrating an OCC signal reception operation of an OCC reception node according to the second embodiment of the present invention.

FIG. 14 is a flowchart illustrating an OCC signal reception operation of an OCC reception node according to the second embodiment of the present invention.

Referring to FIG. 14, the receiver 1221 of the OCC reception node 1220 may detect blinking states of a plurality of light sources included in the transmitter 1212 of the OCC transmission node 1210. Specifically, an image sensor (for example, a camera, etc.) included in the receiver 1221 of the OCC reception node 1220 may continuously photograph images and deliver the images to the demodulator 1223 of the OCC reception node 1220. The demodulator 1223 of the OCC reception node 1220 may detect a blinking state of a light source (for example, LED, etc.) included in the OCC transmission node based on images acquired from the image sensor (S1410). In addition, the demodulator 1223 of the OCC reception node 1220 may acquire a binary sequence by converting the blinking state of the light source included in the transmitter 1212 of the OCC transmission node 1210 (S1420). The demodulator 1223 of the OCC reception node 1220 may correct errors in acquired symbols (S1430).

Figure 15:
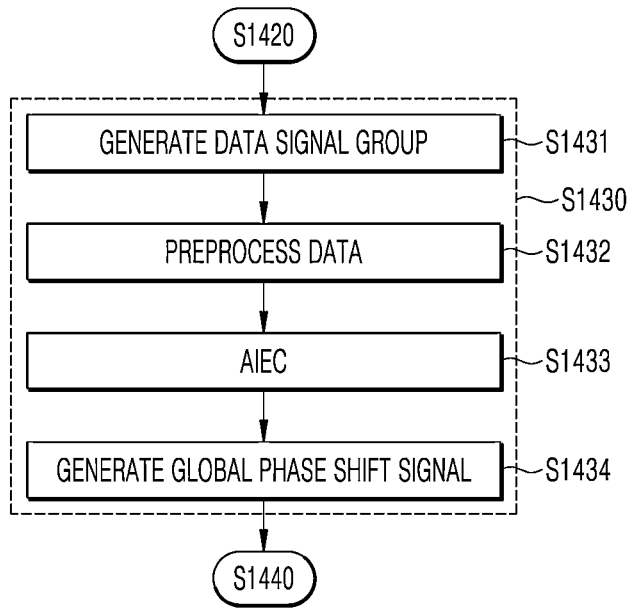
FIG. 15 is a flowchart illustrating an error correction operation of the OCC reception node according to the second embodiment of the present invention.

FIG. 15 is a flowchart illustrating an error correction operation of the OCC reception node according to the second embodiment of the present invention.

Referring to FIG. 15, the demodulator 1223 of the OCC reception node 1220 may group binary sequences for every n*M/2 (=n*2^{k-1}) bits to acquire a data signal group of n*M/2 bits (S1431). The number of symbols included in the data signal group may be changed according to a modulation scheme of a signal transmitted by the OCC transmission node 1210.

The demodulator 1223 of the OCC reception node 1220 may perform data preprocessing before correcting an error of symbols from the data signal group (S1432). The demodulator 1223 of the OCC reception node 1220 may modulate the symbols to reflect the Hamming distance between the symbols. The demodulator 1223 of the OCC reception node 1220 may acquire a preprocessed data signal group (S1432), and determine whether the preprocessed data signal group has an error.

The demodulator 1223 of the OCC reception node 1220 receiving an OCC signal may determine whether the data signal group is included in Table 2, Table 3, or Table 6. When the data signal group is not included in Table 2, Table 3, or Table 6, the demodulator 1223 of the OCC reception node 1220 may determine that there is an error in the data signal group.

The OCC reception node 1220 determining that there is an error in the data signal group may correct the error in the received data signal group (S1433). An error correction operation of step S1433 may be an artificial intelligent error correction (AIEC) operation performed by an artificial neural network included in the OCC reception node 1220.

Figure 16:
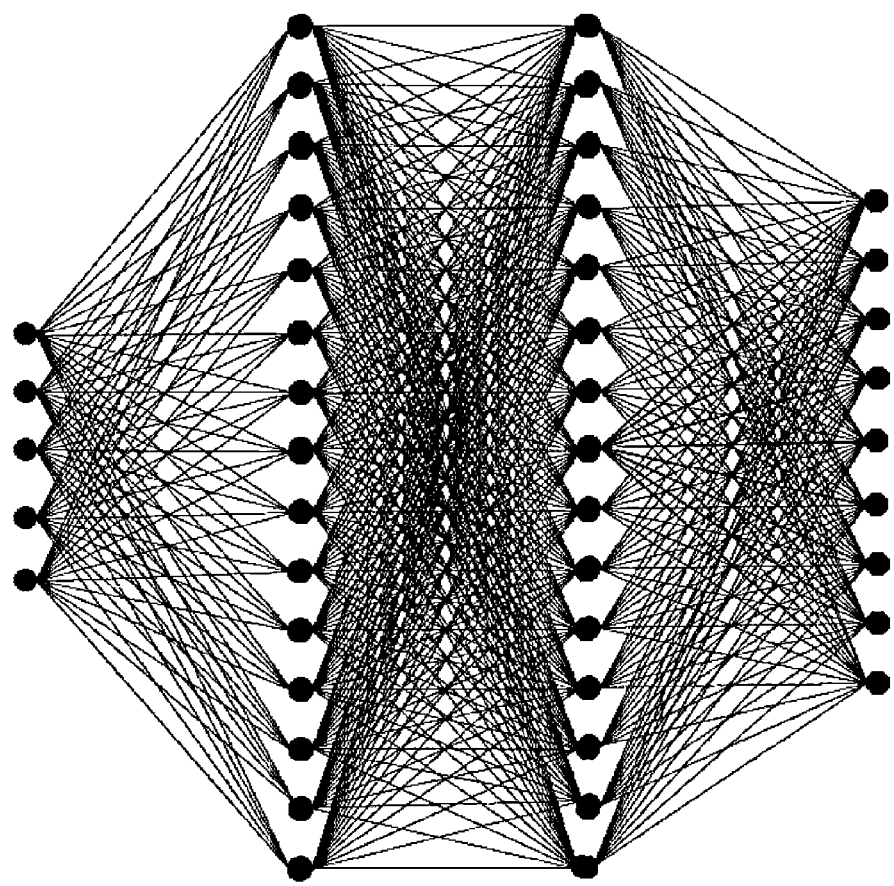
FIG. 16 is a conceptual diagram illustrating an artificial neural network included in the OCC reception node according to the second embodiment of the present invention.

FIG. 16 is a conceptual diagram illustrating an artificial neural network included in the OCC reception node according to the second embodiment of the present invention.

Referring to FIG. 16, the artificial neural network of the OCC reception node 1220 may include a plurality of layers, and each layer may include a plurality of artificial nodes. In addition, the artificial neural network of the OCC reception node 1220 may include a plurality of adaptive weight vectors, and artificial nodes included in each layer of the artificial neural network may be connected by weight vectors. The artificial neural network of the OCC reception node may include a plurality of layers and artificial nodes according to preset parameters, and may correct an error in the data signal group received by the OCC reception node 1220.

For example, upon receiving a data signal group modulated by a DS8-PSK scheme, the OCC reception node 1220 may correct an error in the data signal group using an artificial neural network set based on parameters of Table 7.

TABLE 7

| | |
|---|---|
| Number of layers | 4 |
| Number of hidden layers | 2 |
| Number of artificial nodes per layer | 12-81-81-8 |

Referring to Table 7, the artificial neural network of the OCC reception node 1220 may include four layers. A first layer may be a layer to which a preprocessed data signal group is input. The first layer may include 12 artificial nodes, and each artificial node may be an artificial node to which bits acquired as a result of data preprocessing are input.

In addition, a second layer may be a layer that outputs an error-corrected data signal group from the data signal group input from the first layer. The second layer may include eight artificial nodes, and each artificial node included in the second layer may indicate the data signal group defined in Tables 2, 3 and 6.

Two of the four layers may be hidden layers. In addition, each hidden layer may include 81 artificial nodes. A hidden layer may be connected to an input layer through a weight vector, or a hidden layer may be connected to an output layer through a weight vector. The artificial neural network of the OCC reception node 1220 may acquire an error-corrected data signal group according to weight vectors of the artificial neural network by using a bit of the data signal group generated as a result of data preprocessing as an input value.

The OCC reception node 1220 may perform a learning operation of updating the weight vectors of the artificial neural network. The learning operation may be performed by a multilayer perceptron classifier included in the OCC reception node 1220.

The OCC reception node 1220 may further include a multilayer perceptron classifier. The multilayer perceptron classifier may train an artificial neural network through a preset learning algorithm. The learning algorithm may include learning algorithms such as a supervised learning algorithm and a non-supervised learning algorithm.

The artificial neural network of the OCC reception node 1220 may generate an error-corrected data signal group by correcting an error in the data signal group by performing a feed-forward operation. The multilayer perceptron classifier of the OCC reception node 1220 may calculate error information between a data signal group in which an error is corrected through an artificial neural network and a data signal group transmitted by the OCC transmission node 1210. The multilayer perceptron classifier of the OCC reception node 1220 may perform a learning operation of correcting weight vectors between layers of the artificial neural network by back-propagating the calculated error information. The multilayer perceptron classifier of the OCC reception node 1220 may perform the learning operation based on parameters defined in Table 8.

TABLE 8

| | |
|---|---|
| Optimization algorithm | Adam-optimizer |
| Normalization parameter | $10^{-4}$ |
| Number of learning epochs | 500 |

The multilayer perceptron classifier of the OCC reception node 1220 may correct weight vectors between layers of the artificial neural network through a preset optimization algorithm. The optimization algorithm may include gradient descent, etc., and referring to Table 8, may further include an Adam-optimizer algorithm. The multilayer perceptron classifier of the OCC reception node 1220 may repeatedly perform a learning operation as many as a preset number of epochs (refer to Table 8, 500 times).

Referring back to FIG. 15, the demodulator 1223 of the OCC reception node 1220 may acquire a group ID and a global phase shift signal from the error-corrected data signal group (S1434). The global phase shift signal may be a signal having an integer value ranging from 0 to $M-1=2^k-1$.

The demodulator 1223 of the OCC reception node 1220 may acquire a binary data signal D[i] by converting the acquired group ID and global phase shift signal (S1440). For example, when M=8 and k=3, the modulator 1223 of the OCC reception node 1220 may acquire the binary data signal D[i] from the group ID and the global phase shift signal according to Table 1 (S1440).

Figure 17:
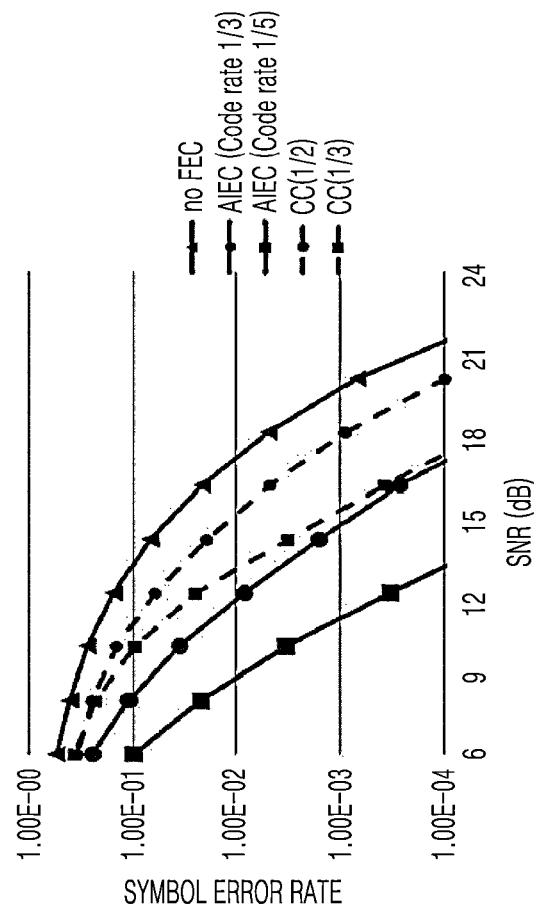
FIG. 17 is a graph for description of an effect of the error correction operation of the OCC reception node according to the second embodiment of the present invention.

FIG. 17 is a graph for description of an effect of the error correction operation of the OCC reception node according to the second embodiment of the present invention.

Specifically, compared to when error correction is performed under the condition of a code rate of 1/2 or 1/3 according to the conventional convolution code (CC) scheme, error correction performance is improved when error correction is performed under the condition of a code rate of 1/3 or 1/5 according to an embodiment of the present invention. In particular, it is confirmed that the error correction performance is improved even under the condition of the same code rate.

Given a code rate of 1/n, as n has a higher value, the error correction performance is improved. However, more communication resources are required and communication efficiency is lowered. Accordingly, there is a need for an error correction technology capable of efficiently communicating while improving the error correction performance. As illustrated in the graph of FIG. 17, compared to the conventional CC scheme, in an AIEC scheme used for error correction of an OCC signal in the OCC reception node according to the embodiment of the present invention, error correction performance is significantly improved even under the same code rate condition, and thus it is possible to increase the efficiency of communication while improving the error correction performance.

Hereinafter, a communication system according to a third embodiment of the present invention will be described with reference to FIGS. 18 to 27.

Figure 18:
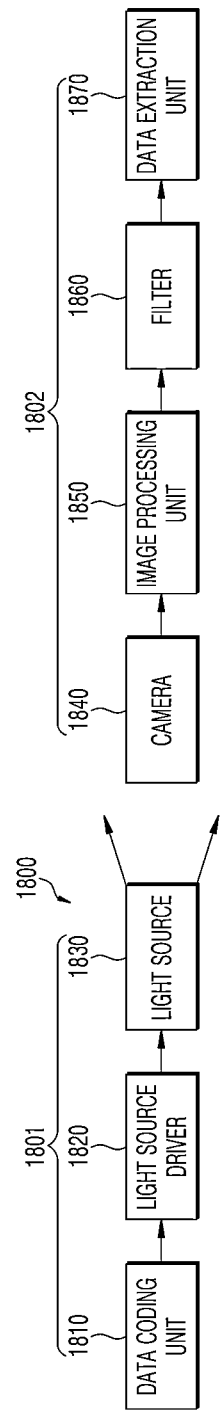
FIG. 18 is a block diagram schematically illustrating an OCC system according to a third embodiment of the present invention.

FIG. 18 is a block diagram schematically illustrating an OCC system according to the third embodiment of the present invention.

Referring to FIG. 18, the OCC system 1800 according to the third embodiment of the present invention may include an OCC transmission node 1801 and an OCC reception node 1802.

The OCC transmission node 1801 may include a data coding unit 1810, a light source driver 1820, and a light source 1830. The OCC reception node 1802 may include a camera 1840, an image processing unit 1850, and a data extraction unit 1870.

The data coding unit 1810 may code data to be transmitted in the OCC system 1800. Such coding may be implemented using various schemes. For example, when data to be transmitted is 1, the data may correspond to ON of the light source 1830, and when data is 0, the data may correspond to OFF of the light source 1830. This example may be set differently according to a pulse frequency of the light source 1830. For example, when data is 1, the light source 1830 may correspond to ON-ON, and when data is 0, the light source 1830 may correspond to OFF-OFF.

As such, in the present invention, the data coding unit 1810 may match an ON/OFF state of the light source 1830 corresponding to data to transmit the data through ON/OFF of the light source 1830 in the future. In the present invention, the data coding unit 1810 may code data using, for example, a Manchester coding technique, a 4B6B coding technique, etc. In addition, the data coding unit 1810 may configure the coded data into a data symbol and generate a data packet including the data symbol. Such a data packet is constructed by arranging data including digital bits 1 and 0 in a row. A structure of such a data packet will be described in detail with reference to FIG. 19.

The light source driver 1820 may drive the light source 1830 according to the coded data as described above. For example, the light source 1830 may be turned ON and OFF according to bits 1 and 0 of the data. The light source driver 1820 turns the light source 1830 ON/OFF according to a preset pulse frequency. As described above, the light source driver 1820 outputs data to be transmitted through ON/OFF control of the light source 1830.

The light source 1830 serves as a transmitter in the OCC system 1800 of the present invention. The light source 1830 may be an LED, and at least one light source may be provided. As described above, the light source 1830 may be turned ON or OFF with a preset pulse frequency by the light source driver 1820 according to data coded by the data coding unit 1810. According to the present embodiment, when a plurality of light sources 1830 is provided, the light sources may be arranged in 1×N, arranged in M×1, or arranged in M×N. Naturally, the light sources may be arranged in various shapes, such as a circular shape, a radial shape, and an oval shape. When a pulse frequency at which the light source 1830 is turned ON/OFF is 110 times per second or more, the human eye cannot distinguish ON/OFF and recognizes the light source 1830 as being continuously ON. Naturally, such a pulse frequency is adjustable.

The camera 1840 serves as a receiver in this OCC system 1800. The camera 1840 may be a camera that captures an image using a rolling shutter scheme. Specifically, the camera 1840 includes a rolling shutter type image sensor combined in a plurality of rows, and may continuously capture a blinking state of the light source 1830 for each row according to a preset frame rate. To this end, the rolling shutter type image sensor may be provided therein. Each row of the image sensor is sequentially exposed at regular time intervals for a preset exposure time (integration time). A frame time is a last exposure time in a first column and a last exposure time in a last column, and the sum of the exposure time and the frame time is a capture time. An image captured during such a capture time appears as a white band when the LED 1830 is turned ON, and appears as a black band when the LED 1830 is turned OFF. Changes in the ON/OFF state of the LED are recorded sequentially during the capture time. In this instance, the white band and the black band may be set to represent, for example, 1 and 0 as data, respectively. In this way, in the rolling shutter camera 1840, it is possible to receive multiple data within one frame. As the image sensor, for example, a CMOS sensor may be used. In this instance, the rolling shutter camera 1840 may start photographing at any time while the LED 1830 is turned ON or OFF. In this case, it is necessary to distinguish a start frame and a data frame from a captured image. In addition, in the present embodiment, even though a frame rate for photographing an ON/OFF image of the LED 1830 of the rolling shutter camera 1840 is preset, a technique is required to enable accurate data reception even when the actual frame rate changes, which will be described in detail below. In the present embodiment, the rolling shutter camera 1840 may include a digital camera, a camera mounted on a mobile phone or a smart device, etc.

The image processing unit 1850 may generate a brightness signal according to a brightness value of an ON/OFF image of the light source 1830 photographed for each of a plurality of rows by the camera 1840. Specifically, as described above, in a process in which the light source 1830 is turned ON or OFF according to data, a white band and a black band appear, and brightness values of these bands may be different. For example, a color that appears according to ON/OFF of the light source 1830 may be displayed as, for example, a brightness value of 0 to 255. In this case, the white band may indicate a brightness value of 255, and the black band may indicate a brightness value of 0. Naturally, a range of these brightness values can be changed.

The filter unit 1860 may detect a bit sequence from a brightness signal of an ON/OFF image of the light source 1830 generated by the image processing unit 1850. The filter unit 1860 may include a match filter, and detect a bit sequence by performing a convolution operation on a brightness sequence generated by the image processing unit 1850 and an additionally generated inversion sequence. A method of detecting a bit sequence by the filter unit 1860 will be described in detail with reference to FIG. 22.

The data extraction unit 1870 may extract data from a bit sequence detected by the filter unit 1860, which corresponds to restoring data coded in an ON/OFF image of the light source 1830 according to data to be transmitted from the data coding unit 1810.

For example, when data 1 to be transmitted by the data coding unit 1810 corresponds to ON of the light source 1830 and data 0 corresponds to OFF of the light source 1830, the data extraction unit 1850 may extract 1 from an ON image of the light source 1830 and extract 0 from an OFF image. In this instance, in the present invention, data can be extracted using a brightness value from a brightness signal of the ON/OFF image of the light source 1830. Specifically, data may be extracted by combining a slope of the brightness signal, that is, rising and falling of the brightness signal.

Figure 19:
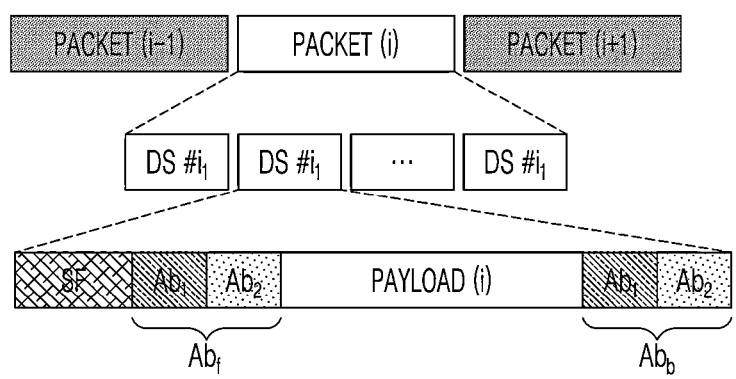
FIG. 19 is a structural diagram schematically illustrating a structure of a data packet transmitted and received in the OCC system according to the third embodiment of the present invention.

FIG. 19 is a structural diagram schematically illustrating a structure of a data packet transmitted and received in the OCC system according to the third embodiment of the present invention.

Referring to FIG. 19, each data packet transmitted and received in the OCC system according to the third embodiment of the present invention may include a plurality of identical data sub-packets DS. Each data sub-packet DS may include a start frame SF, an asynchronous bit Ab, and a payload or a data symbol.

The start frame SF may be disposed at a front end of each data packet for synchronization and to distinguish each data packet.

The asynchronous bit Ab may be disposed at front and rear ends of the data symbol to distinguish each data packet. The asynchronous bit Ab may include a first asynchronous bit $Ab_1$ and a second asynchronous bit $Ab_2$. Each of the first asynchronous bit $Ab_1$ and the second asynchronous bit $Ab_2$ may have 1 bit. A value of the first asynchronous bit $Ab_1$ may change for every two data packets, and a value of the second asynchronous bit $Ab_2$ may change for every data packet.

That is, the asynchronous bit Ab including the first asynchronous bit $Ab_1$ and the second asynchronous bit $Ab_2$ may be set to change in value according to a predefined order such as 00, 01, 10, 11, etc., every time a data packet is transmitted, and asynchronous bits Ab of the data sub-packets DS included in the same data packet may be set to have the same value. Accordingly, when the OCC reception node 1802 receives the data sub-packet (DS) or a part of the data sub-packet (DS), the OCC reception node 1802 may verify whether there is missing data to be transmitted or restore data through the asynchronous bit Ab included therein.

The asynchronous bit Ab disposed at the front end of the data symbol may be referred to as a front end asynchronous bit $Ab_f$, and the asynchronous bit Ab disposed at the rear end of the data symbol may be referred to as a rear end asynchronous bit $Ab_b$.

The payload or the data symbol means data content to be transmitted through OCC communication.

As described above, in the data sub-packet DS, the start frame SF, the front end asynchronous bit $Ab_f$, the data symbol, and the rear end asynchronous bit $Ab_b$ may be sequentially disposed.

A process of extracting data using the above-described data frame structure will be described in detail with reference to FIG. 20.

FIG. 20 is a diagram illustrating a principle of a method of extracting and restoring data in the OCC system according to the third embodiment of the present invention.

In FIG. 20, the case in which each data packet includes two data sub-packets DS is illustrated as an example for convenience of description. However, the illustration of FIG. 20 is merely an example for describing the present invention, and the present invention is not limited thereto.

Figure 20A:
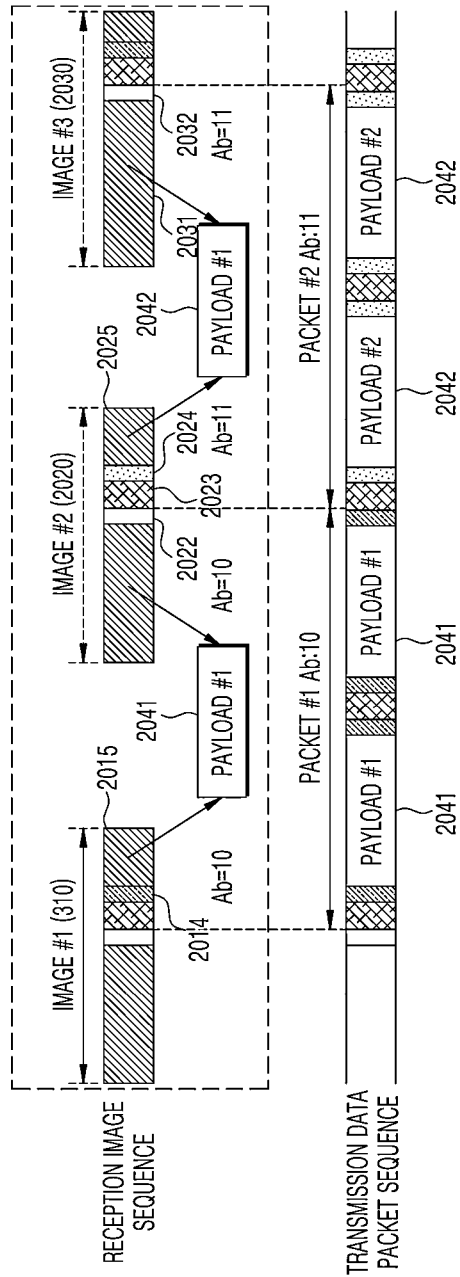
FIG. 20 is a diagram illustrating a principle of a method of extracting and restoring data in the OCC system according to the third embodiment of the present invention.
Figure 20B:
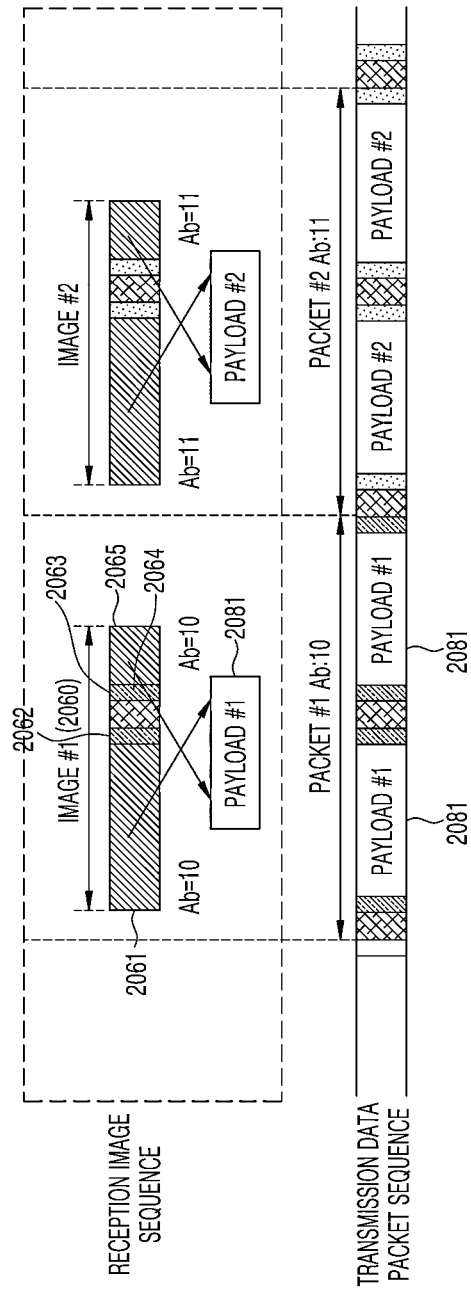

As illustrated in FIGS. 20A and 20B, while the light source 1830 is turned ON/OFF according to a structure of a data packet coded according to data to be transmitted by the light source driver 1820 according to the third embodiment of the present invention, the camera 1840 may photograph the light source 1830 at an arbitrary point in time at a predetermined frame rate. Since there is a section in which the camera 1840 cannot receive an image according to periodic opening and closing of the shutter, each image frame photographed by the camera 1840 cannot completely contain the entire data transmitted through the light source 1830, and thus each of the bit sequences 2010, 320, and 330 detected from each image frame restores original data through a restoration process of the data extraction unit 1870. FIG. 20A illustrates a principle of an 'inter-frame fusion' method according to a 3-1th embodiment of the present invention, and FIG. 20B illustrates a principle of an 'intra-frame fusion' method according to a 3-2th embodiment of the present invention.

Hereinafter, the 'inter-frame fusion' method according to the 3-1th embodiment of the present invention will be described with reference to FIG. 20A. As illustrated in FIG. 20A, when a rear end asynchronous bit 2022 at a front end of a start frame 2023 and a front end asynchronous bit 2024 at a rear end of the start frame 2023 detected in one bit sequence 2020 have different values (for example, 10≠11), a payload 2021 at a front end of the rear end asynchronous bit 2022 and a payload 2025 at a rear end of the front end asynchronous bit 2024 may be regarded as payloads of data sub-packets DS included in different data packets. Therefore, in this case, the data extraction unit 1870 may merge the payload 2021 at the front end of the rear end asynchronous bit 2022 with a payload 2015 at a rear end of a front end asynchronous bit 2014 included in a previous bit sequence 2010 to restore an existing payload 2041. In addition, the data extraction unit 1870 may merge the payload 2025 at the rear end of the front end asynchronous bit 2024 with a payload 2035 at a front end of a rear end asynchronous bit 2032 included in a subsequent bit sequence 2030 to restore an existing payload 2042.

Hereinafter, the 'intra-frame fusion' method according to the 3-2th embodiment of the present invention will be described with reference to FIG. 20B. As illustrated in FIG. 20B, when a rear end asynchronous bit 2062 at a front end of a start frame 2063 and a front end asynchronous bit 2034 at a rear end of the start frame 2063 detected in one bit sequence 2060 have the same value (for example, 10=10), a payload 2061 at a front end of the rear end asynchronous bit 2062 and a payload 2065 at a rear end of the front end asynchronous bit 2064 may be regarded as payloads of data sub-packets DS included in the same data packet. Therefore, in this case, the data extraction unit 1870 may merge the payload 2061 at the front end of the rear end asynchronous bit 2062 with the payload 2065 at the rear end of the front end asynchronous bit 2064 to restore an existing payload 2081.

As described above, in FIG. 20, the case where each data packet includes two data sub-packets DS has been described as an example for convenience of description. However, the present invention is not limited thereto. For example, the data packet according to the present invention may include three or more data sub-packets DS. In this case, the data extraction unit 1870 may perform the aforementioned 'inter-frame fusion' and 'intra-frame fusion' a plurality of times in order to restore one payload, and accordingly, data restoration performance of OCC communication by a C-OOK scheme can be improved.

Figure 21:
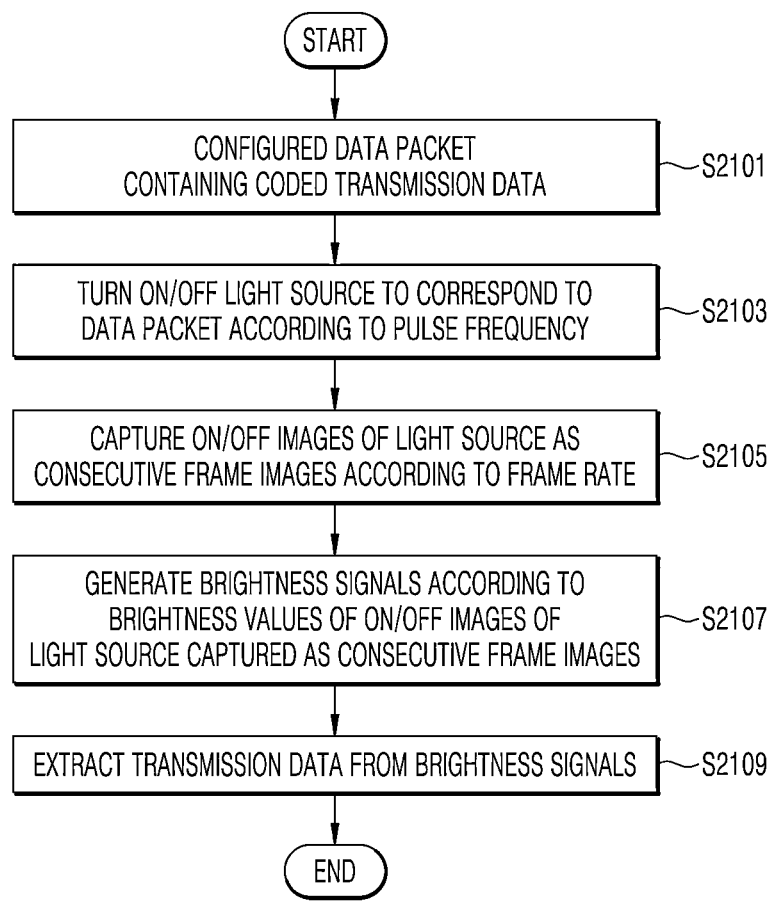
FIG. 21 is a flowchart schematically illustrating an OCC communication method according to the third embodiment of the present invention.

FIG. 21 is a flowchart schematically illustrating an OCC communication method according to the third embodiment of the present invention.

Referring to FIG. 21, in the OCC communication method according to the third embodiment of the present invention, the data coding unit 1810 may code data to be transmitted and configure a data packet including the coded data (S2101). In the embodiment of the present invention, data packets distinguished for each of a plurality of pieces of data to be transmitted are consecutively arranged, and each of these data packets may include N (N is a natural number) consecutively repeated data sub-packets DS. In addition, each data sub-packet DS may include a payload or a data symbol containing data coded as described above, front end and rear end asynchronous bits Ab disposed at a front end and a rear end of the payload, respectively, and a start frame SF disposed at a front end of the front end asynchronous bit Ab.

Subsequently, according to a pulse frequency set by the light source driver 1820, the light source 1830 may be turned ON/OFF to correspond to a data packet (S2103). Accordingly, the light source 1830 may be turned ON/OFF to correspond to the data packet including data. Specifically, the light source 1830 may be turned ON/OFF to correspond to the start frame SF, the front end asynchronous bit Ab, the data symbol, and the rear end asynchronous bit Ab included in the data sub-packet DS. In addition, the data sub-packet DS may be turned ON/OFF to be repeated N preset times, and further turned ON/OFF to be distinguished for each data packet.

Subsequently, an ON/OFF image of the light source 1830 may be captured in a rolling shutter scheme according to a frame rate set by the camera 1840 (S2105). Specifically, the camera 1840 may photograph ON/OFF images of the light source 1830 for each of a plurality of rows during one capture time and capture the ON/OFF images as consecutive images.

Thereafter, the image processing unit 1850 may generate brightness signals according to brightness values of the ON/OFF images of the light source 1830 captured as consecutive image frames for each row (S2107), and the filter unit 1860 and the data extraction unit 1870 may extract data from the brightness signals (S2109).

Figure 22:
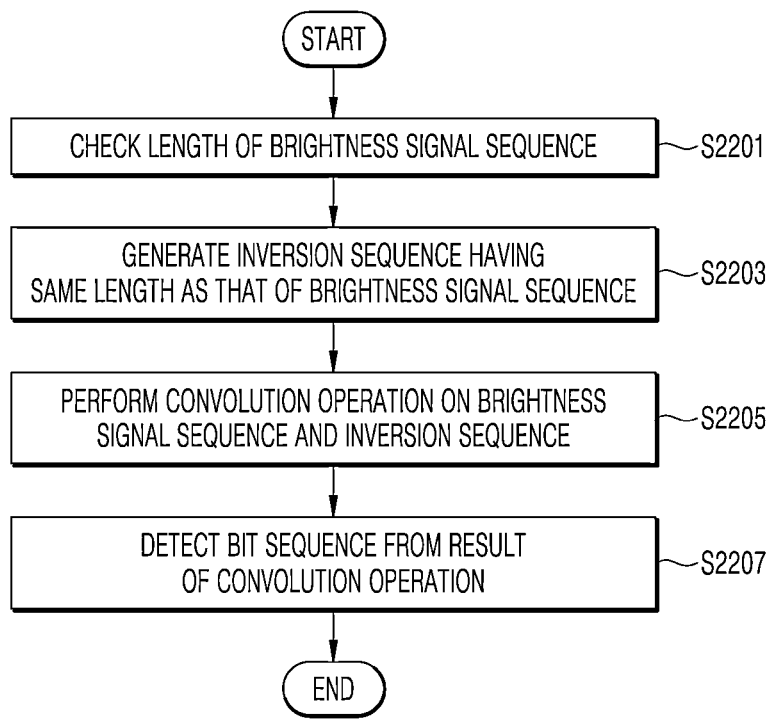
FIG. 22 is a flowchart schematically illustrating a bit sequence detection method of a filter unit according to the third embodiment of the present invention.

FIG. 22 is a flowchart schematically illustrating a bit sequence detection method of the filter unit according to the third embodiment of the present invention.

Referring to FIG. 22, a match filter included in the filter unit 1860 according to the third embodiment of the present invention may check a length of each brightness signal sequence generated by the image processing unit 1850 (S2201). Subsequently, the match filter may generate an inversion sequence having the same length as that of the brightness signal sequence (S2203). When the inversion sequence is generated, the match filter may perform a convolution operation on the brightness signal sequence and the inversion sequence (S2205).

Then, the match filter may detect a bit sequence from a result of the convolution operation (S2207). For example, the match filter may detect a bit sequence based on a point having a maximum value as a result of the convolution operation. For example, the match filter may detect a point having a local maximum as a bit having a value of 1 and a point having a local minimum as a bit having a value of 0, which may be set differently according to a modulation scheme of the transmission node side of the OCC system.

Figure 25:
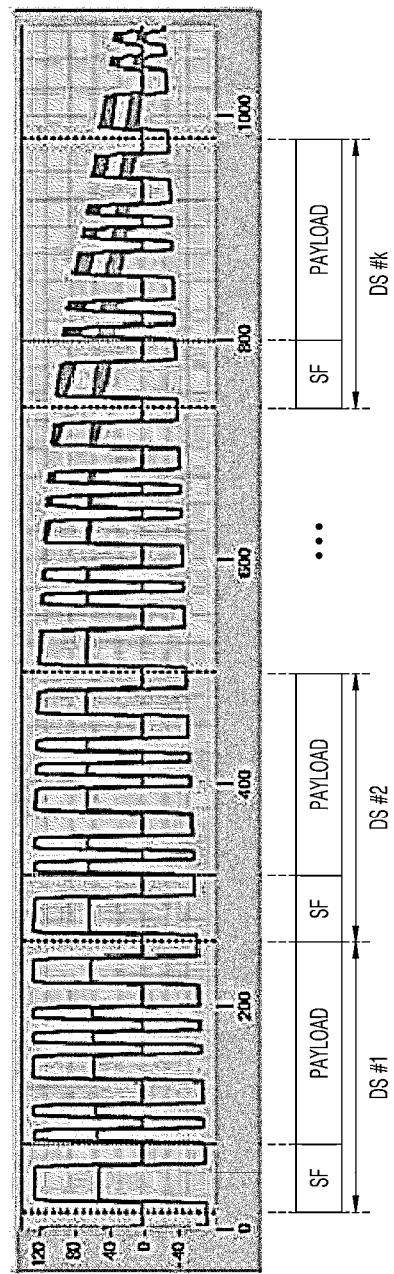
FIGS. 25 and 26 are graphs for description of a problem of a method of detecting a bit in a reception node of a conventional OCC system.

FIGS. 25 and 26 are graphs for description of a problem of a method of detecting a bit in a reception node of a conventional OCC system, and FIG. 27 is a graph for description of a method of detecting a bit in the reception node of the OCC system according to the third embodiment of the present invention.

Figures 26A, 26B:
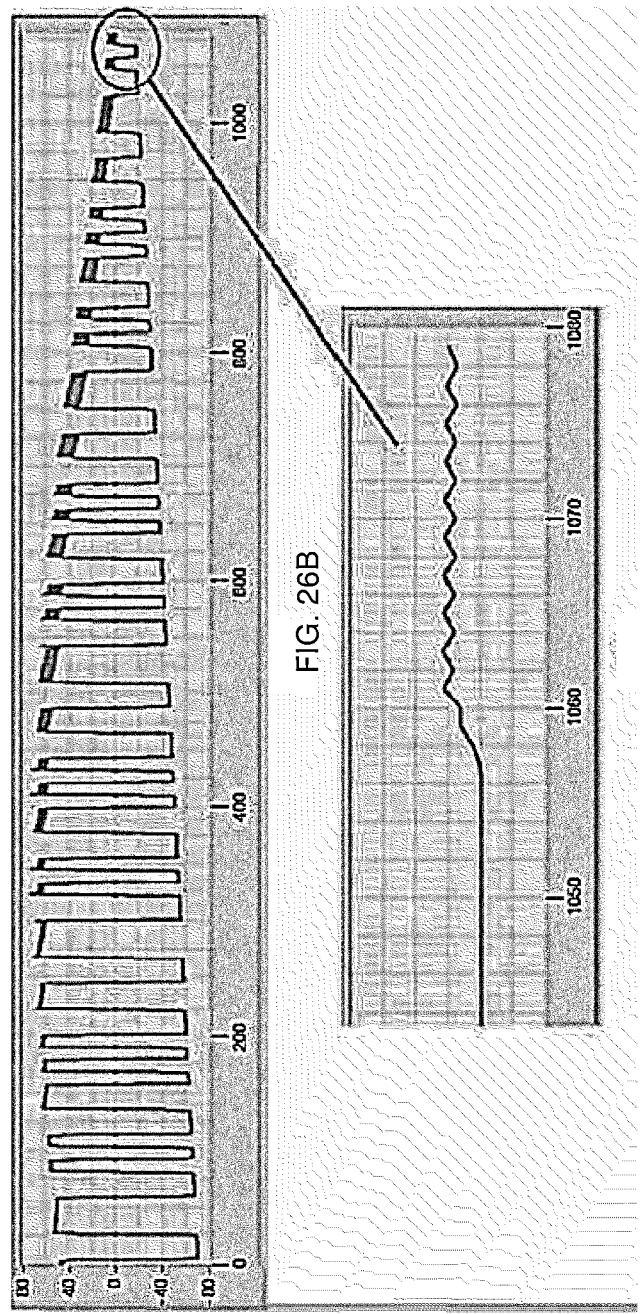

Referring to FIGS. 25 and 26A, the OCC system can detect a bit sequence from a brightness signal sequence generated by photographing blinking of the light source, and detect a detailed configuration of a start frame SF, a payload, or other data packets from the bit sequence. In the conventional art, for detecting the bit sequence from the brightness signal sequence in this way, for example, a scheme such as a zero crossing scheme has been used.

In an OCC system using the zero crossing scheme to detect a bit from an image of a light source captured by a camera according to the conventional art, a bit is detected with reference to a point at which a waveform of a brightness signal graph derived from the captured image of the light source passes through a zero axis. Such a scheme can effectively operate under an ideal indoor environmental condition where a distance between the light source and the camera is short and there are few light sources other than the light source of the OCC system due to a low noise ratio.

However, the scheme may be difficult to effectively operate under a condition other than the above-mentioned ideal indoor environmental condition, for example, a condition where a distance between the light source and the camera is long or there are a large number of light sources other than the light source of the OCC system, or an outdoor environmental condition. Under these conditions, the strength of the OCC signal may decrease and the strength of noise may increase, and thus the performance of OCC communication may deteriorate.

For example, when the intensity of the noise increases by a certain level or more and the amplitude due to the noise becomes larger than the amplitude due to the OCC signal, as illustrated in FIG. 26B, a point at which the waveform of the graph passes through the zero axis is caused by noise, not the OCC signal, and thus bit detection may fail or malfunction.

Figure 27A:
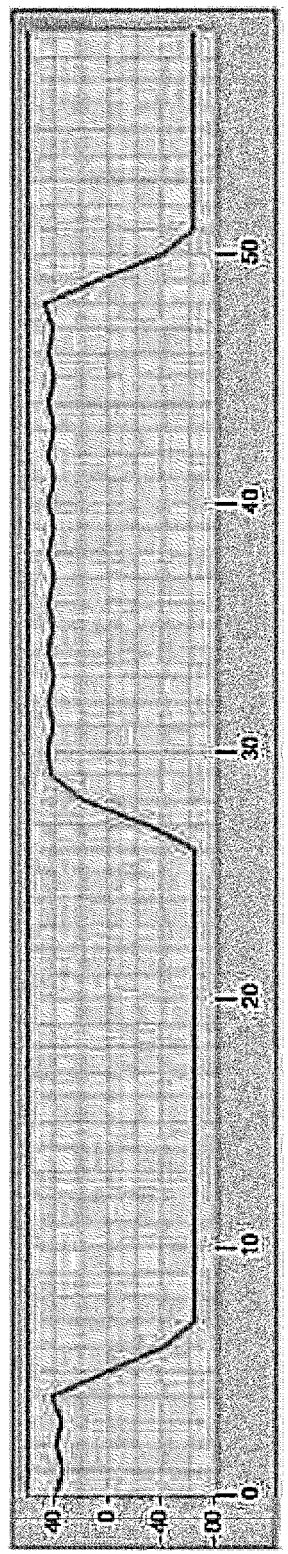
FIG. 27 is a graph for description of a method of detecting a bit in a reception node of the OCC system according to the third embodiment of the present invention.
Figure 27B:
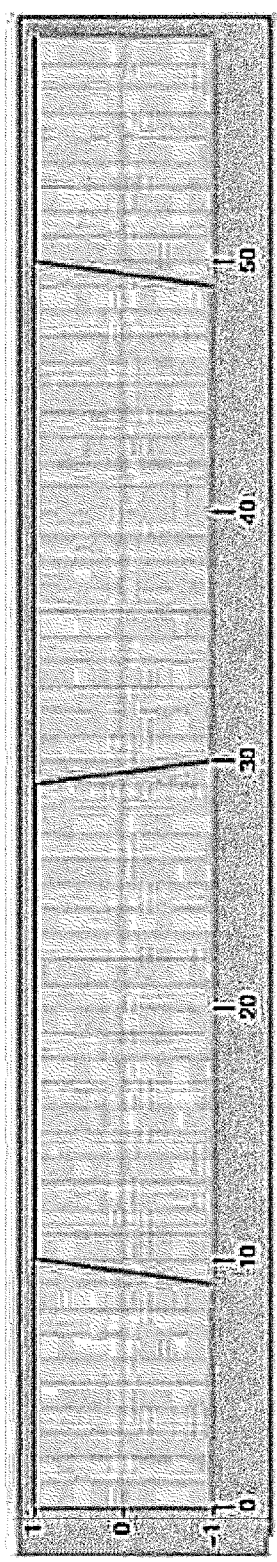
Figure 27C:
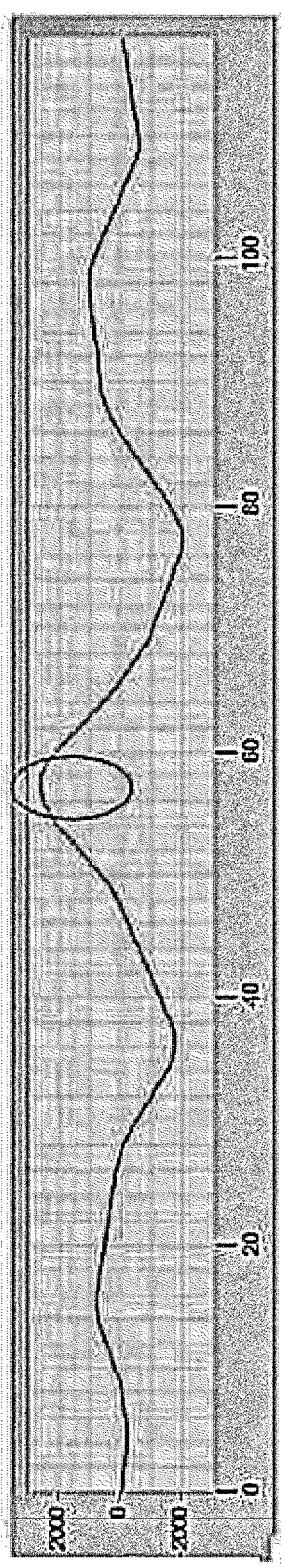

FIG. 27A illustrates a brightness signal sequence generated by the image processing unit 1850 according to the third embodiment of the present invention, FIG. 27B illustrates an inversion sequence generated by the match filter according to the third embodiment of the present invention, and FIG. 27C illustrates a result of a convolution operation on a brightness signal sequence and an inversion sequence according to the third embodiment of the present invention.

Referring to FIG. 27C, a bit sequence can be detected based on a point having a local maximum (for example, an ellipse on a graph) in a waveform of the result of the convolution operation on the brightness signal sequence and the inversion sequence according to the third embodiment of the present invention.

Referring back to FIG. 22, the match filter of the filter unit 1860 according to the third embodiment of the present invention may generate an inversion sequence based on a table set in advance according to the encoding scheme of the transmission node of the OCC system.

For example, when the transmission node of the OCC system encodes data according to a Manchester scheme, the match filter may generate an inversion sequence according to Table 9.

TABLE 9

| 1B (input) | 2B (output) |
| --- | --- |
| 0 | 01 |
| 1 | 10 |

Meanwhile, when the transmission node of the OCC system encodes data according to a 4B6B scheme, the match filter may generate an inversion sequence according to Table 10.

TABLE 10

| 4B (input) | 6B (output) | Hex |
|---|---|---|
| 0000 | 001110 | 0 |
| 0001 | 001101 | 1 |
| 0010 | 010011 | 2 |
| 0011 | 010110 | 3 |
| 0100 | 010101 | 4 |
| 0101 | 100011 | 5 |
| 0110 | 100110 | 6 |
| 0111 | 100101 | 7 |
| 1000 | 011001 | 8 |
| 1001 | 011010 | 9 |
| 1010 | 011100 | A |
| 1011 | 110001 | B |
| 1100 | 110010 | C |
| 1101 | 101001 | D |
| 1110 | 101010 | E |
| 1111 | 101100 | F |

Figure 23:
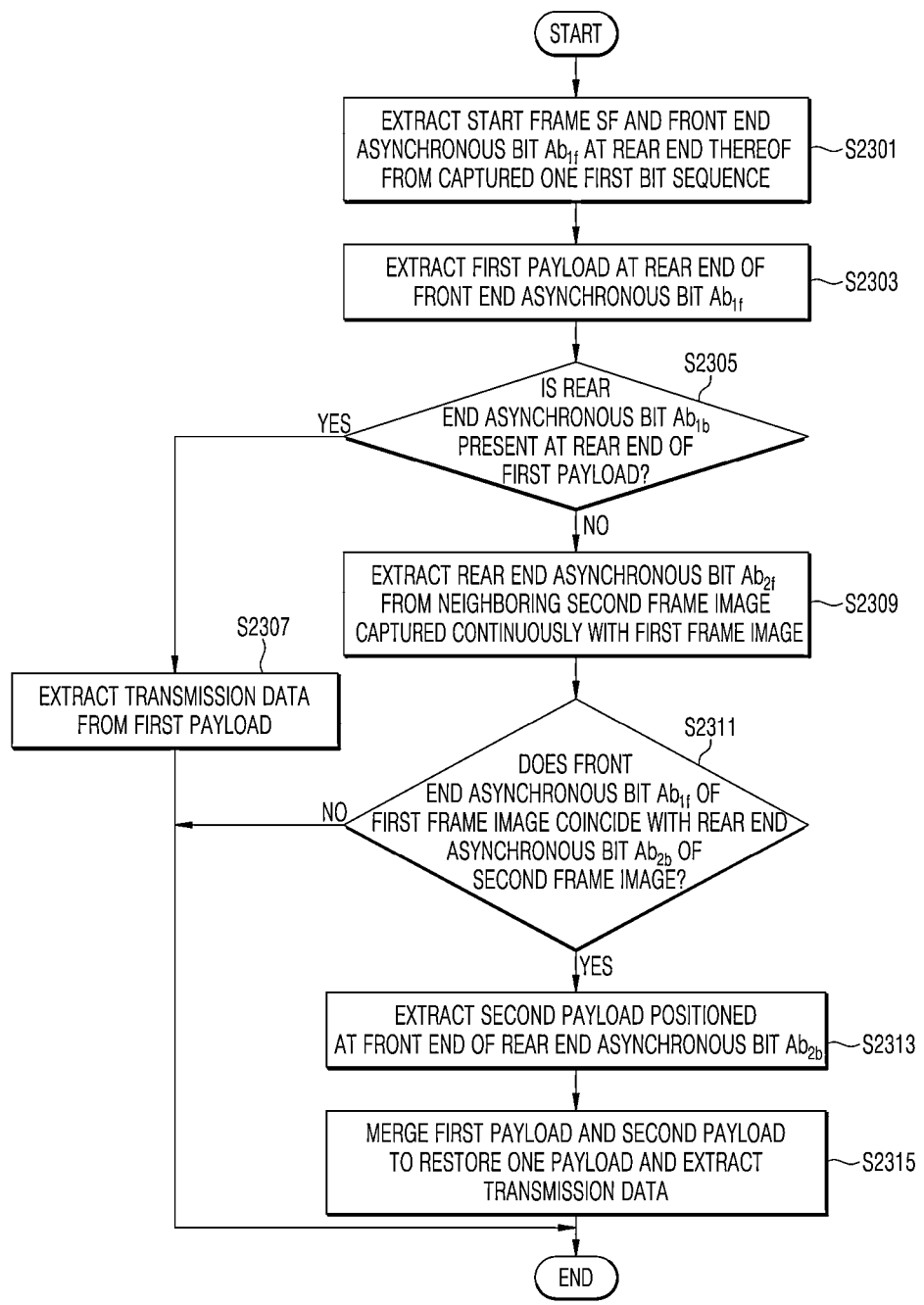
FIG. 23 is a flowchart schematically illustrating a data extraction method of a data extraction unit according to a 3-1th embodiment of the present invention.

FIG. 23 is a flowchart schematically illustrating a data extraction method of the data extraction unit according to the 3-1th embodiment of the present invention.

Referring to FIG. 23, in order to extract data according to the 3-1th embodiment of the present invention, the data extraction unit 1870 may first extract a start frame SF and a front end asynchronous bit $Ab_{1f}$ disposed at a rear end of the start frame SF from a captured one first bit sequence (S2301). Subsequently, the data extraction unit 1870 may extract a first payload disposed at a rear end of the front end asynchronous bit $Ab_{1f}$ (S2303).

Subsequently, the data extraction unit 1870 may determine whether a rear end asynchronous bit Abib is present at a rear end of the first payload in the first bit sequence (S2305). When the rear end asynchronous bit Abib is present at the rear end of the first payload, the data extraction unit 1870 may extract data from the first payload (S2307).

On the other hand, when there the rear end asynchronous bit Abib is not present at the rear end of the first payload, a rear end asynchronous bit $Ab_{2b}$ may be extracted from a neighboring second bit sequence captured continuously with the first bit sequence (S2309).

Subsequently, the data extraction unit 1870 may determine whether the rear end asynchronous bit $Ab_{2b}$ extracted from the second bit sequence coincides with an asynchronous bit $Ab_{1f}$ at a front end extracted from the first bit sequence (S2311). When the rear end asynchronous bit $Ab_{2b}$ extracted from the second bit sequence coincides with the asynchronous bit $Ab_{1f}$ at the front end extracted from the first bit sequence, the second payload positioned at the front end of the rear end asynchronous bit $Ab_{2b}$ can be extracted (S2313).

As described above with reference to FIGS. 19 and 20, according to the third embodiment of the present invention, all asynchronous bits Ab of each data sub-packet DS included in the same data packet have the same value. Accordingly, the fact that front end or rear end asynchronous bits Ab included in two neighboring bit sequences are the same means that both the bit sequences include signals of data sub-packets included in the same data packet, that is, data to be transmitted through a payload is the same.

Subsequently, an original payload may be restored by merging or combining a payload extracted from the first bit sequence and a payload extracted from the second bit sequence, and data may be extracted therefrom (S2315). Accordingly, data is extracted from two neighboring bit sequences, which is referred to as 'inter-frame fusion' in the present invention.

Figure 24:
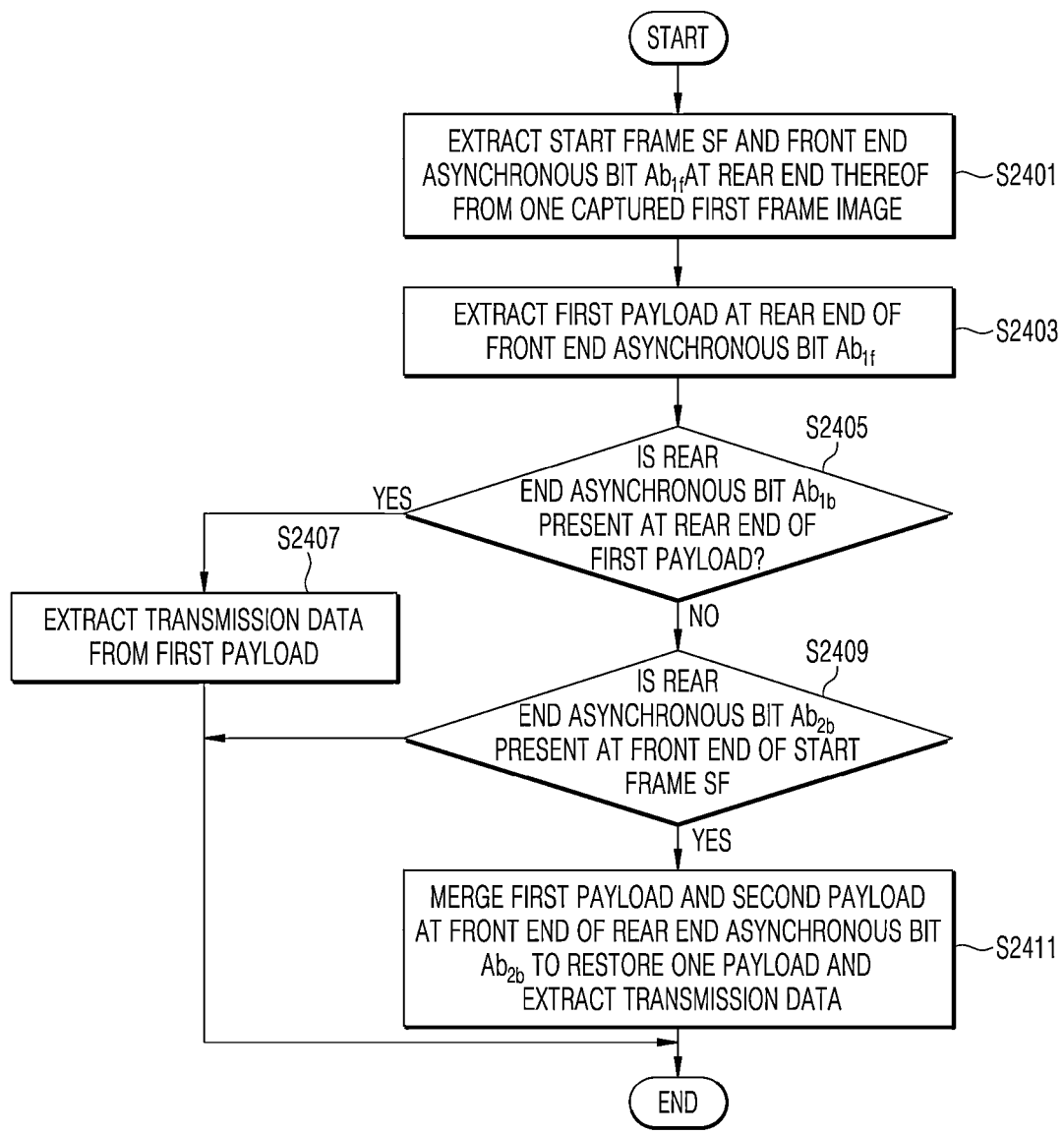
FIG. 24 is a flowchart schematically illustrating a data extraction method of a data extraction unit according to a 3-2th embodiment of the present invention.

FIG. 24 is a flowchart schematically illustrating a data extraction method of the data extraction unit according to the 3-2th embodiment of the present invention.

Referring to FIG. 24, in order to extract data according to the 3-2th embodiment of the present invention, the data extraction unit 1870 may first extract a start frame SF and a front end asynchronous bit $Ab_{1f}$ disposed at a rear end of the start frame from one captured first bit sequence (S2401). Subsequently, the data extraction unit 1870 may extract a first payload disposed at a rear end of the front end asynchronous bit $Ab_{1f}$ (S2403).

Subsequently, the data extraction unit 1870 may determine whether a rear end asynchronous bit Abib is present at a rear end of the first payload in the first bit sequence (S2405). When the rear end asynchronous bit Abib is present at the rear end of the first payload, the data extraction unit 1870 may extract data from the first payload (S2407).

On the other hand, when the rear end asynchronous bit Abib is not present at the rear end of the first payload, it may be determined whether a rear end asynchronous bit $Ab_{2b}$ is present at a front end of the start frame SF extracted from the first bit sequence (S2409). When the rear end asynchronous bit $Ab_{2b}$ is present at a front end of the start frame SF, a second payload disposed at a front end of the rear end asynchronous bit $Ab_{2b}$ and the first payload extracted in step S2403 may be merged or combined to restore an original payload, and data may be extracted therefrom (S2411). Accordingly, data is extracted from payloads included in the front end and the rear end of the start frame SF in one bit sequence, respectively, which is referred to as 'intra-frame fusion' in the present invention.

As described above, according to the OCC system according to the present invention, the original payload can be restored by merging a plurality of payloads included in one or more bit sequences through a front end and asynchronous bit Ab included in each data packet.

In the case of photographing the blinking state of the light source using a camera that is not synchronized with the light source, a portion of a signal of the light source that cannot be photographed may be generated due to the fact that photographing starts at an arbitrary point in time and due to a shutter speed limitation. According to the above-described embodiment of the present invention, through 'inter-frame fusion' or 'intra-frame fusion', it is possible to restore a missing part that cannot be photographed, and thus improve the performance of the OCC communication system.

The methods according to the present invention may be implemented in the form of program instructions that can be executed by various computer means and recorded in a computer-readable medium. The computer-readable medium may include program instructions, data files, data structures, etc., alone or in combination. The program instructions recorded on the computer-readable medium may be specially designed and configured for the present invention, or may be known and available to those skilled in the art of computer software.

Examples of the computer-readable medium include hardware devices specially configured to store and carry out program instructions, such as ROM, RAM, flash memory, etc. Examples of program instructions include not only machine language code such as is generated by a compiler, but also high-level language code that can be executed by a computer using an interpreter, etc. The hardware devices described above may be configured to operate as at least one software module to perform the operations of the present invention, and vice versa.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method of modulating an optical camera communication (OCC) signal by an OCC transmission node configured to transmit an OCC signal, the method comprising:
acquiring a binary data signal;
grouping the binary data signal for every k bits to convert the binary data signal into a set of integer values, wherein each of the integer values of the set of integer values ranges between 0 and M−1, wherein M=$2^k$;
generating a data signal group by mapping the set of integer values to first to Mth mapping sequences in a form of an n*M/2-bit sequence based on a preset symbol group mapping table;
modulating the data signal group to generate a pulse wave signal; and
blinking each of a plurality of light sources included in the OCC transmission node according to the pulse wave signal, wherein:
the symbol group mapping table indicates a connection relationship between the set of integer values each having a value from 0 to M−1 and the first to Mth mapping sequences; and
k and n are integers greater than or equal to 3.

2. The method according to claim 1, wherein the first to Mth mapping sequences are formed in a form of an n*M/2-bit sequence having M/2 n-bit bundles with n bits as a bundle.

3. The method according to claim 2, wherein:
in the first to M/2th mapping sequences, one n-bit bundle has a value of 1, and (M/2−1) n-bit bundles have a value of 0; and
in the (M/2+1)th to Mth mapping sequences, one n-bit bundle has a value of 0, and (M/2−1) n-bit bundles have a value of 1.

4. The method according to claim 1, wherein:
k and n are 3,
the symbol group mapping table further indicates:
a connection relationship between the set of integer values each having a value of 0 to 7 and first to eighth three-symbol sequences; and
a connection relationship between the first to eighth three-symbol sequences and the first to eighth mapping sequences, and
each of the first to eighth three-symbol sequences is generated to have three symbols.

5. The method according to claim 4, wherein:
the first three-symbol sequence is generated to have three symbols set to 1;
each of the second to fourth three-symbol sequences is generated to have one symbol set to 5 and two symbols set to 0;
each of the fifth to seventh three-symbol sequences is generated to have one symbol set to 1 and two symbols set to 4; and
the eighth three-symbol sequence is generated to have three symbols set to 5.

6. The method according to claim 5, wherein each of the first to eighth mapping sequences is generated in a form of a 12-bit sequence by mapping each symbol of the first to eighth three-symbol sequences to a 4-bit signal according to a following table:

| Symbol (input) | 4-bit signal (output) |
|---|---|
| 0 | 0000 |
| 1 | 1000 |
| 4 | 1111 |
| 5 | 0111 |

7. The method according to claim 1, wherein in the symbol group mapping table, the (M/2+1)th to Mth mapping sequences are generated by applying a NOT operation to the first to M/2th mapping sequences.

8. The method according to claim 1, wherein the symbol group mapping table is formed so that a minimum Hamming distance between the first to Mth mapping sequences is 2n.

9. A method of demodulating an OCC signal by an OCC reception node configured to receive an OCC signal, the method comprising:
detecting blinking states of a plurality of light sources included in an OCC transmission node configured to transmit an OCC signal;
converting blinking state information of the light sources into a binary sequence;
grouping the binary sequence for every n*M/2 bits to acquire a data signal group of n*M/2 bits, wherein M=$2^k$;
acquiring a set of integer values from the data signal group based on a preset symbol group mapping table; and
converting the set of integer values to acquire binary data, wherein:
the symbol group mapping table indicates a connection relationship between the set of integer values each having a value from 0 to M−1 and first to Mth mapping sequences; and
the (M/2+1)th to Mth mapping sequences are generated by applying a NOT operation to the first to M/2th mapping sequences,
wherein k and n are integers greater than or equal to 3.

10. The method according to claim 9, wherein the symbol group mapping table is formed so that a minimum Hamming distance between the first to Mth mapping sequences is 2n.

11. The method according to claim 9, wherein the acquiring of the set of integer values includes:
determining whether the data signal group coincides with any one of the first to Mth mapping sequences; and
converting the data signal group into a set of integer values connected to a mapping sequence coinciding with the data signal group when the data signal group coincides with any one of the first to Mth mapping sequences.

12. The method according to claim 9, wherein:
the acquiring of the set of integer values includes:
determining whether the data signal group coincides with any one of the first to Mth mapping sequences;
correcting an error of the data signal group based on a Hamming distance between the data signal group and the first to Mth mapping sequences when the data signal group does not coincide with any one of the first to Mth mapping sequences;
generating an error-corrected data signal group; and
determining again whether the error-corrected data signal group coincides with any one of the first to Mth mapping sequences, and
the correcting of the error is performed by an artificial neural network of the OCC reception node.

13. The method according to claim 12, further comprising:
calculating, after the correcting of the error, error information between a data signal group received by the OCC transmission node and the error-corrected data signal group; and
updating a weight vector of the artificial neural network by back-propagating the error information.

14. An OCC transmission node for transmitting an OCC signal, the OCC transmission node comprising:
a processor;
a plurality of light sources operating under a control of the processor; and
a memory configured to store one or more instructions executed by the processor, wherein:
the one or more instructions are executed to:
acquire a binary data signal;
group the binary data signal for every k bits to convert the binary data signal into a set of integer values, wherein each of the integer values of the set of integer values ranges between 0 and M−1, wherein $M=2^k$;
generate a data signal group by mapping the set of integer values to first to Mth mapping sequences in a form of an n*M/2-bit sequence based on a preset symbol group mapping table;
generate a pulse wave signal by modulating the data signal group; and
blink each of the plurality of light sources according to the pulse wave signal,
the symbol group mapping table indicates a connection relationship between the set of integer values each having a value from 0 to M−1 and the first to Mth mapping sequences, and
k and n are integers greater than or equal to 3.

15. The OCC transmission node according to claim 14, wherein:
the first to Mth mapping sequences are formed in a form of an n*M/2-bit sequence having M/2 n-bit bundles with n bits as a bundle;
in the first to M/2th mapping sequences, one n-bit bundle has a value of 1, and (M/2−1) n-bit bundles have a value of 0; and
in the (M/2+1)th to Mth mapping sequences, one n-bit bundle has a value of 0, and (M/2−1) n-bit bundles have a value of 1.

16. The OCC transmission node according to claim 14, wherein:
k and n are 3,
the symbol group mapping table further indicates:
a connection relationship between the set of integer values each having a value of 0 to 7 and first to eighth three-symbol sequences; and
a connection relationship between the first to eighth three-symbol sequences and the first to eighth mapping sequences, and each of the first to eighth three-symbol sequences is generated to have three symbols.

17. The OCC transmission node according to claim 16, wherein:
the first three-symbol sequence is generated to have three symbols set to 1;
each of the second to fourth three-symbol sequences is generated to have one symbol set to 5 and two symbols set to 0;
each of the fifth to seventh three-symbol sequences is generated to have one symbol set to 1 and two symbols set to 4;
the eighth three-symbol sequence is generated to have three symbols set to 5; and
each of the first to eighth mapping sequences is generated in a form of a 12-bit sequence by mapping each symbol of the first to eighth three-symbol sequences to a 4-bit signal according to a following table:

| Symbol (input) | 4-bit signal (output) |
|---|---|
| 0 | 0000 |
| 1 | 1000 |
| 4 | 1111 |
| 5 | 0111 |

18. The OCC transmission node according to claim 14, wherein in the symbol group mapping table, the (M/2+1)th to Mth mapping sequences are generated by applying a NOT operation to the first to M/2th mapping sequences.

* * * * *